(12) United States Patent
Agranov et al.

(10) Patent No.: US 11,239,267 B2
(45) Date of Patent: *Feb. 1, 2022

(54) HYBRID IMAGE SENSORS WITH IMPROVED CHARGE INJECTION EFFICIENCY

(71) Applicant: APPLE INC., Cupertino, CA (US)

(72) Inventors: Gennadiy A Agranov, Cupertino, CA (US); Oray O. Cellek, Cupertino, CA (US); QingFei Chen, Cupertino, CA (US); Xiangli Li, Cupertino, CA (US)

(73) Assignee: APPLE INC., Cupertino, CA (US)

(*) Notice: Subject to any disclaimer, the term of this patent is extended or adjusted under 35 U.S.C. 154(b) by 136 days.

This patent is subject to a terminal disclaimer.

(21) Appl. No.: 16/607,113

(22) PCT Filed: Apr. 2, 2018

(86) PCT No.: PCT/US2018/025614
§ 371 (c)(1),
(2) Date: Oct. 22, 2019

(87) PCT Pub. No.: WO2018/208386
PCT Pub. Date: Nov. 15, 2018

(65) Prior Publication Data
US 2020/0304743 A1 Sep. 24, 2020

Related U.S. Application Data

(60) Provisional application No. 62/503,344, filed on May 9, 2017.

(51) Int. Cl.
*H01L 27/146* (2006.01)
*H04N 5/378* (2011.01)
(Continued)

(52) U.S. Cl.
CPC .. *H01L 27/14603* (2013.01); *H01L 27/14612* (2013.01); *H01L 27/14636* (2013.01);
(Continued)

(58) Field of Classification Search
CPC ......... H01L 27/14603; H01L 27/14612; H01L 27/14636; H04N 5/363; H04N 5/3745; H04N 5/3597; H04N 5/378
(Continued)

(56) References Cited

U.S. PATENT DOCUMENTS 4,551,757 A 11/1985 Ohkubo et al.
5,068,701 A 11/1991 Prieur-Drevon
(Continued)

FOREIGN PATENT DOCUMENTS

CN 101438409 A 5/2009
CN 104143558 A 11/2014
(Continued)

OTHER PUBLICATIONS

Kozlowski et al., "Infrared Detector Arrays", Handbook of Optics, vol. II, chapter 33, pp. 1-34, year 2010.
(Continued)

*Primary Examiner* — Yogesh K Aggarwal
(74) *Attorney, Agent, or Firm* — Kligler & Associates Patent Attorneys Ltd

(57) ABSTRACT

Imaging apparatus (20) includes a photosensitive medium (22) and a bias electrode (32), which is at least partially transparent, overlying the photosensitive medium. An array of pixel circuits (26) is formed on a semiconductor substrate (30). Each pixel circuit includes a pixel electrode (24) coupled to collect the charge carriers from the photosensitive medium; a readout circuit (75) configured to output a signal indicative of a quantity of the charge carriers collected by the pixel electrode; a skimming gate (48) coupled
(Continued)

between the pixel electrode and the readout circuit; and a shutter gate (46) coupled in parallel with the skimming gate between a node (74) in the pixel circuit and a sink site. The shutter gate and the skimming gate are opened sequentially in each of a sequence of image frames so as to apply a global shutter to the array and then to read out the collected charge carriers via the skimming gate to the readout circuit.

16 Claims, 22 Drawing Sheets

(51) Int. Cl.
*H04N 5/3745* (2011.01)
*H04N 5/359* (2011.01)
*H04N 5/363* (2011.01)

(52) U.S. Cl.
CPC ........... *H04N 5/3597* (2013.01); *H04N 5/363* (2013.01); *H04N 5/378* (2013.01); *H04N 5/3745* (2013.01)

(58) Field of Classification Search
USPC ................. 348/294–324; 250/208.1; 257/292
See application file for complete search history.

(56) References Cited

U.S. PATENT DOCUMENTS

| | | | |
|---|---|---|---|
| 5,146,302 | A | 9/1992 | Kumada |
| 6,452,153 | B1 | 9/2002 | Lauxtermann et al. |
| 7,709,777 | B2 | 5/2010 | Rhodes |
| 7,916,196 | B2 | 3/2011 | Peizerat et al. |
| 9,196,781 | B2 | 11/2015 | Tian et al. |
| 9,204,073 | B2 | 12/2015 | Mishina et al. |
| 9,234,969 | B2 | 1/2016 | Arques |
| 9,601,538 | B2 | 3/2017 | Agranov et al. |
| 9,692,968 | B2 | 6/2017 | Mandelli |
| 10,136,084 | B1 * | 11/2018 | Solheim ............... H04N 5/3535 |
| 2006/0001754 | A1 | 1/2006 | Yanagisawa et al. |
| 2010/0002110 | A1 | 1/2010 | Ota |
| 2010/0118173 | A1 | 5/2010 | Toros et al. |
| 2011/0149104 | A1 | 6/2011 | Mabuchi |
| 2011/0309462 | A1 | 12/2011 | Sargent et al. |
| 2012/0241591 | A1 | 9/2012 | Wan et al. |
| 2014/0022354 | A1 | 1/2014 | Okigawa et al. |
| 2014/0103197 | A1 | 4/2014 | Tubert |
| 2014/0016027 | A1 | 7/2014 | Yang et al. |
| 2014/0252201 | A1 | 9/2014 | Li et al. |
| 2016/0037093 | A1 | 2/2016 | Mandelli et al. |
| 2017/0207355 | A1 | 7/2017 | Beiley et al. |
| 2017/0208273 | A1 | 7/2017 | Mandelli et al. |
| 2017/0263686 | A1 | 9/2017 | Beiley et al. |
| 2017/0264836 | A1 | 9/2017 | Mandelli et al. |
| 2017/0359497 | A1 | 12/2017 | Mandelli et al. |

FOREIGN PATENT DOCUMENTS

| | | |
|---|---|---|
| CN | 104580947 A | 4/2015 |
| CN | 105374832 A | 3/2016 |
| CN | 105810765 A | 7/2016 |
| CN | 106105181 A | 11/2016 |
| EP | 2337075 A2 | 6/2011 |
| JP | 2012004953 A | 1/2012 |

OTHER PUBLICATIONS

Fossum et al., "Infrared Readout Electronics for Space Science Sensors: State of the Art and Future Directions", SPIE vol. 2020, Infrared Technology XIX, pp. 262-285, 1993.

International Application # PCT/US2018/025614 Search Report dated Jun. 18, 2018.

CN Application #201880028722.4 Office Action dated Apr. 26, 2021.

"Research and Design of Charge Pump Applied to CMOS Image Sensors," Master's Thesis, China's Excellent Master's Thesis Full-text Database, pp. 1-70, issue date Nov. 6, 2009.

CN Application #201880028722.4 Office Action dated Nov. 16, 2021.

* cited by examiner

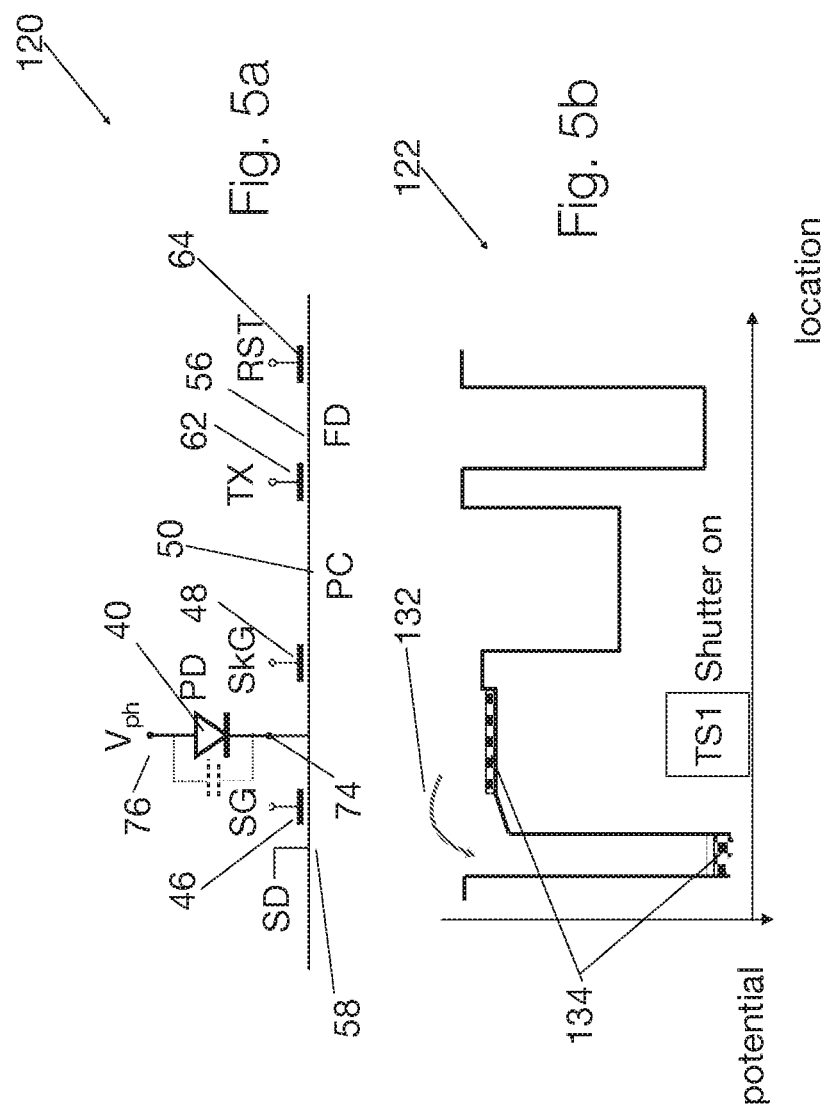

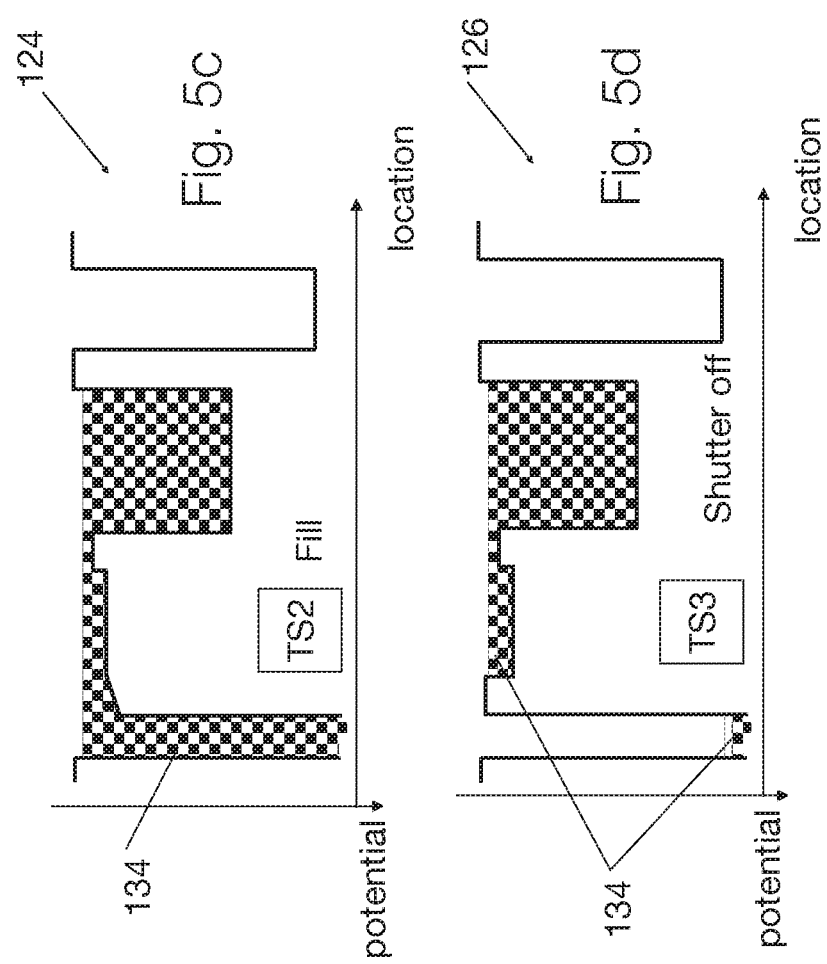

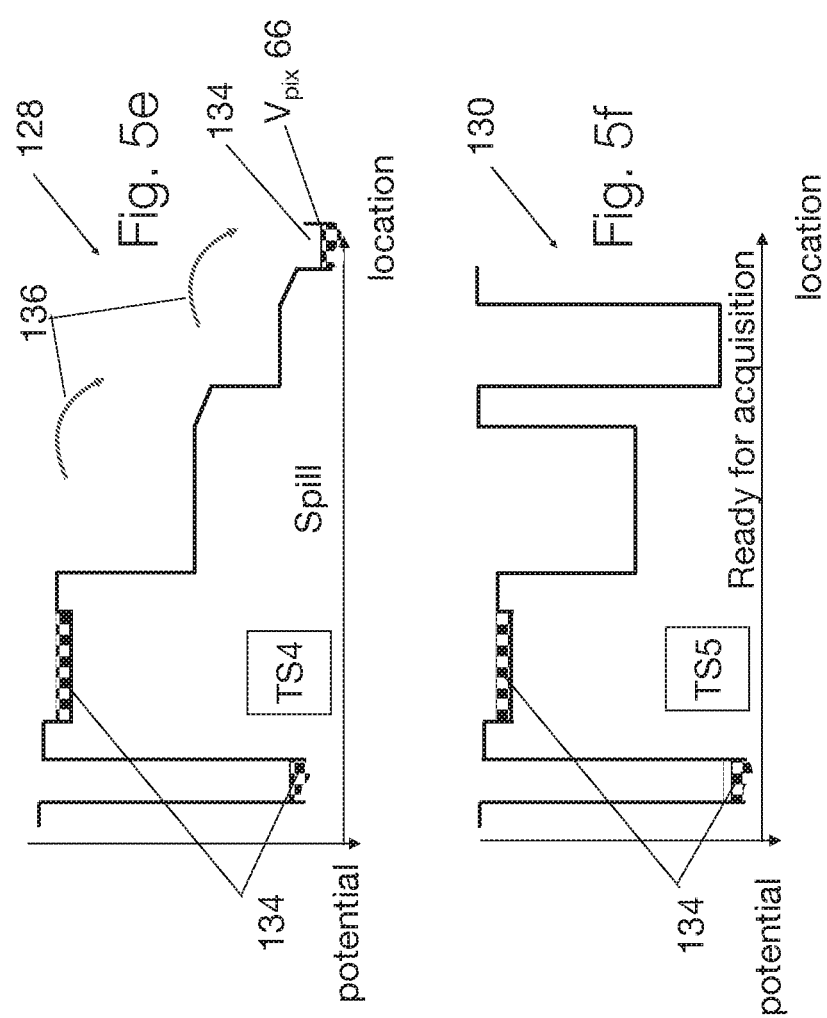

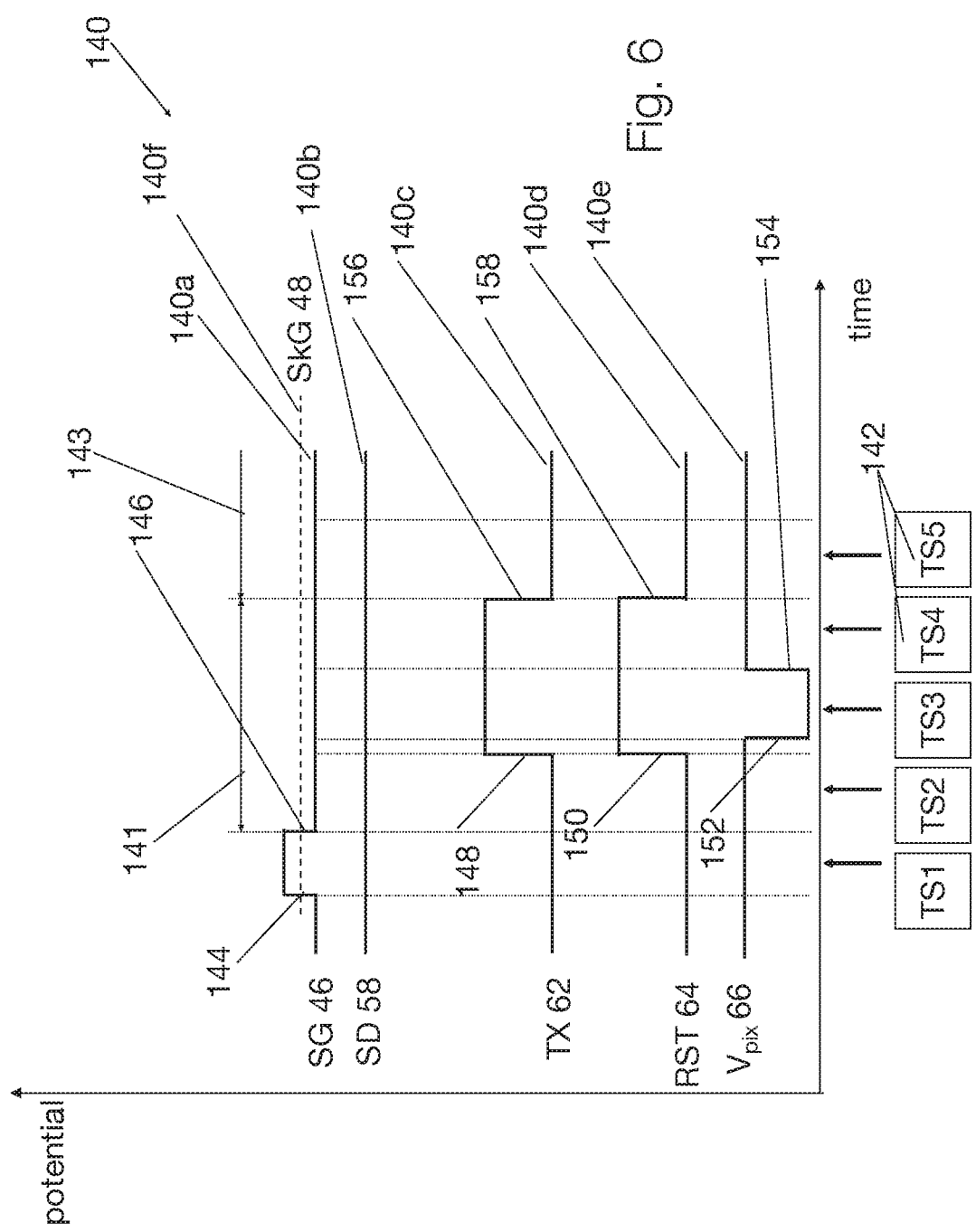

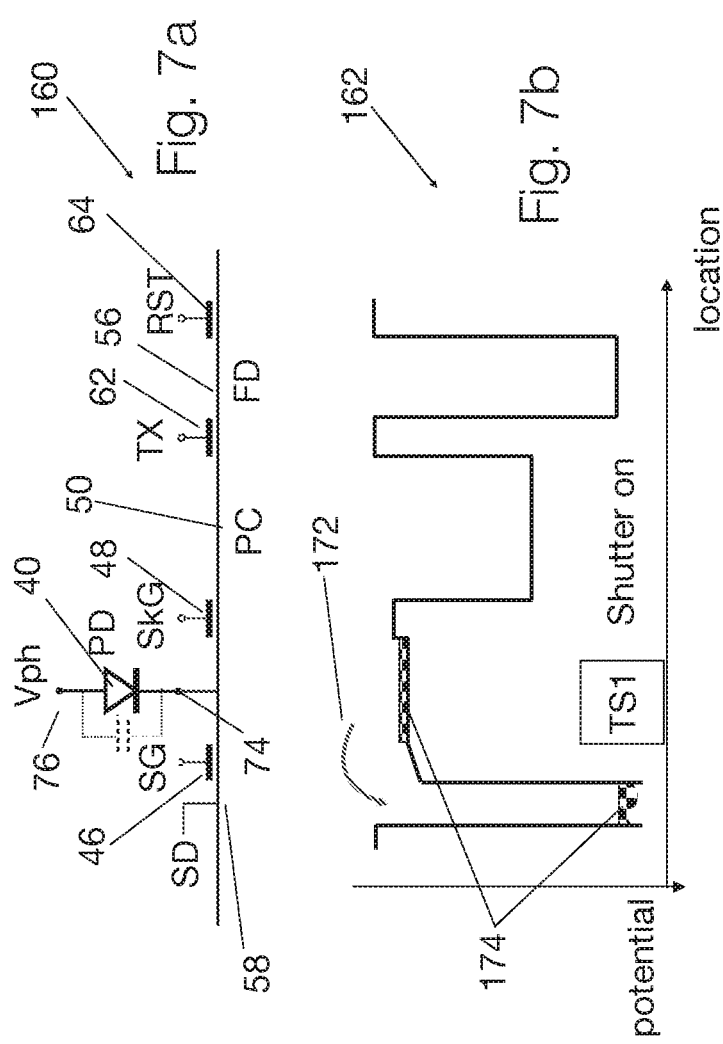

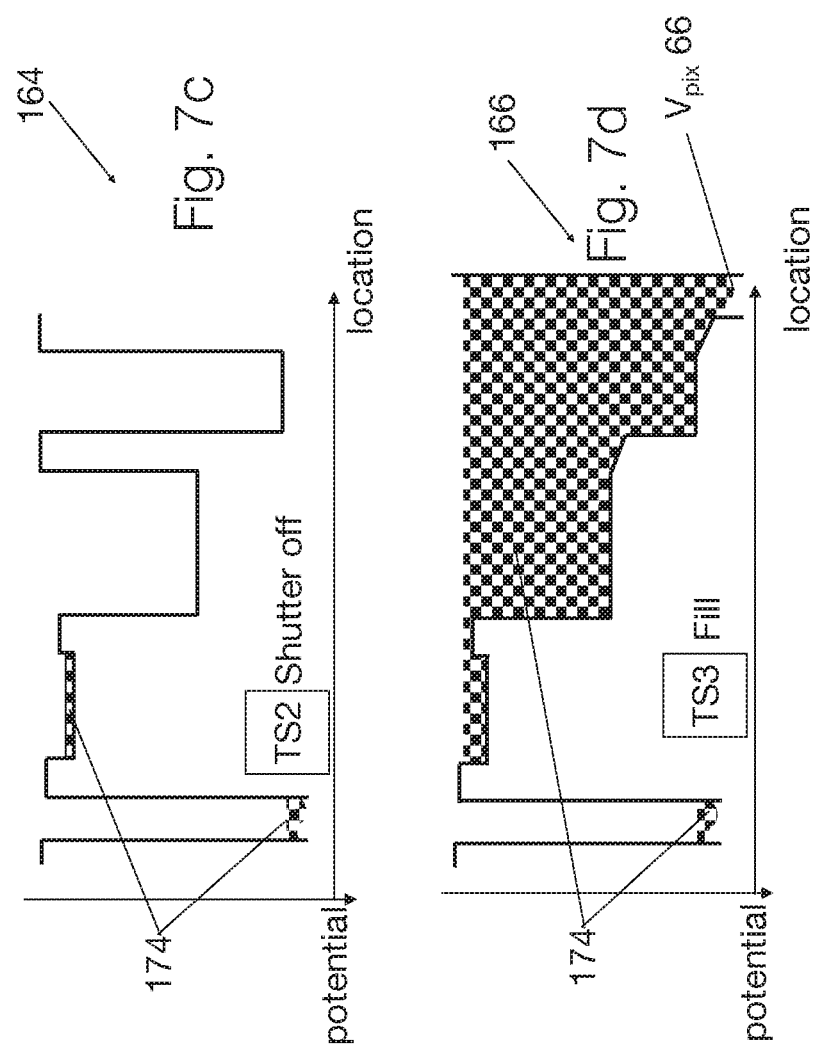

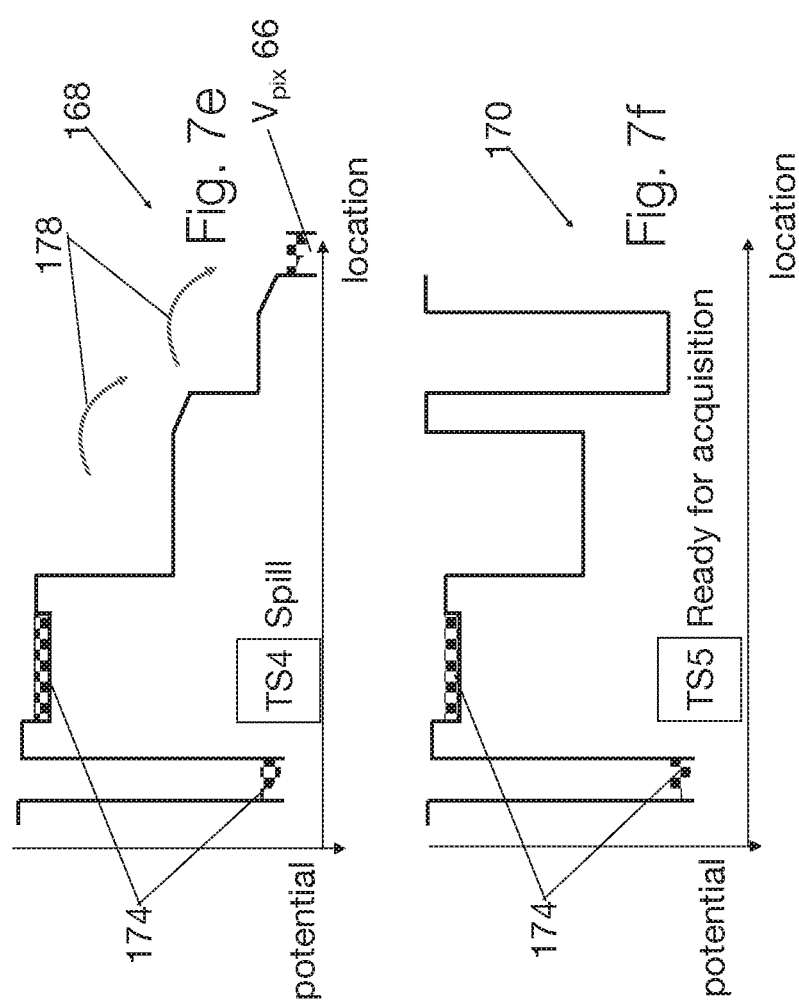

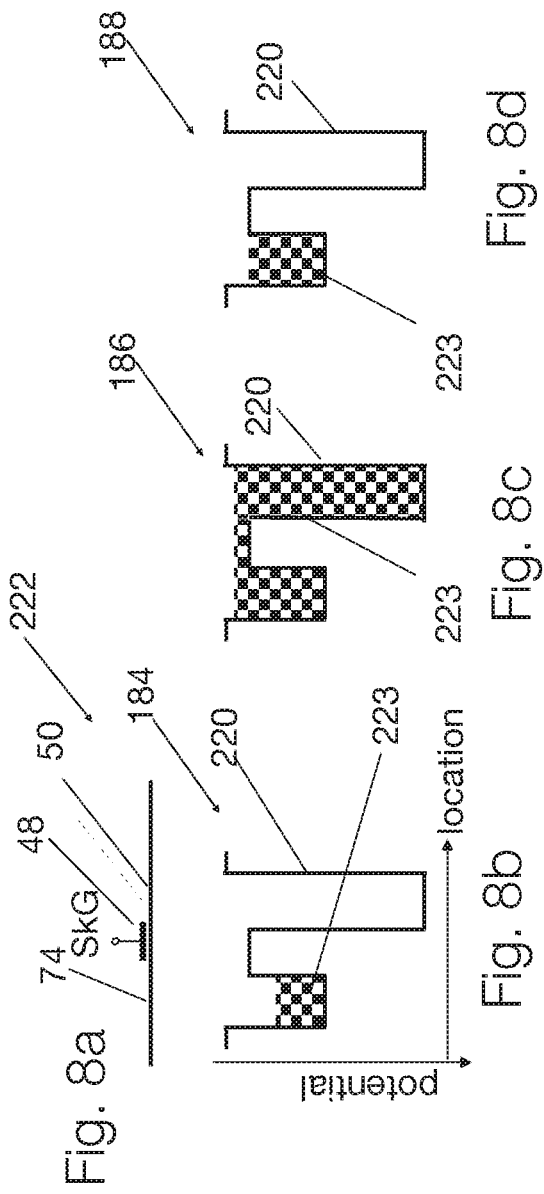
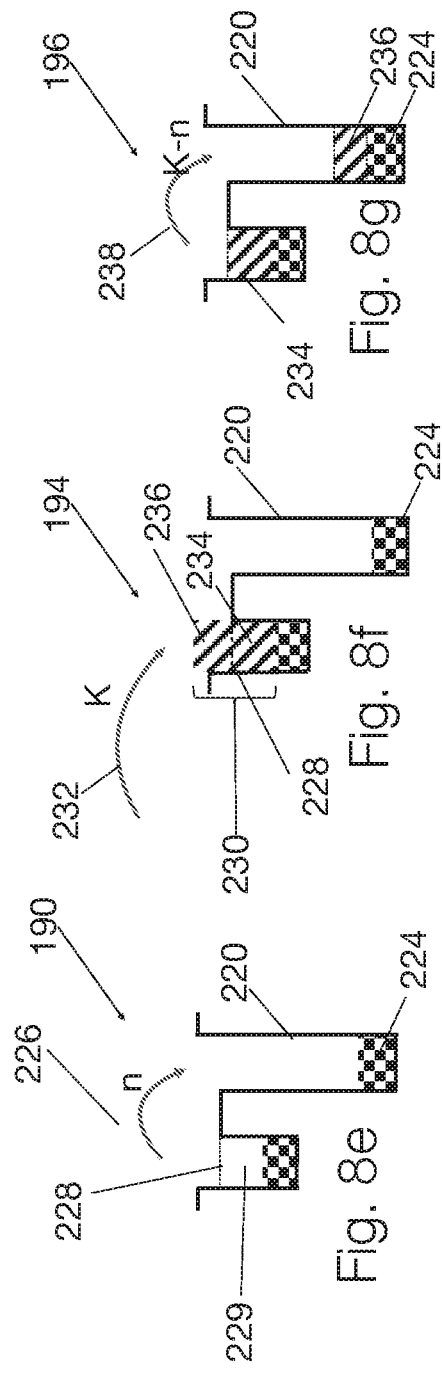

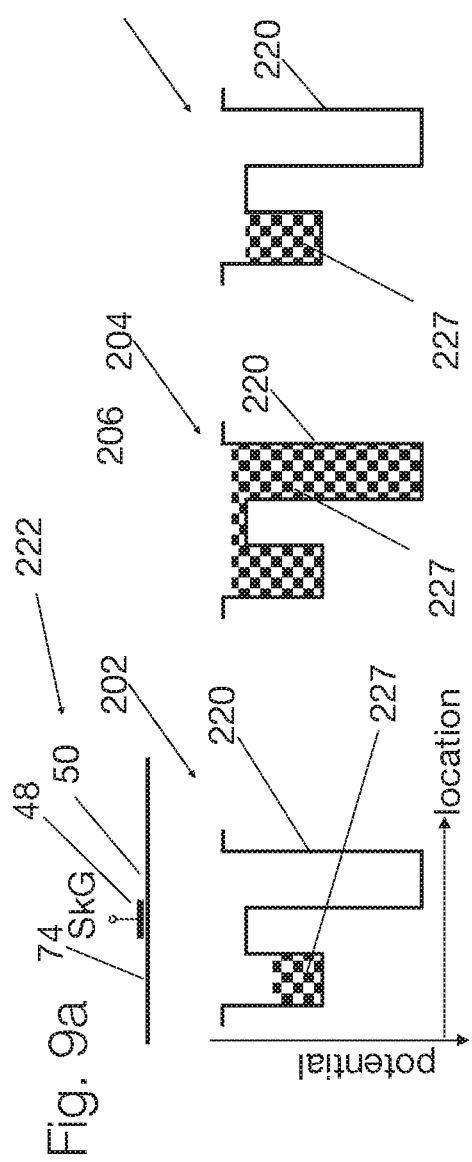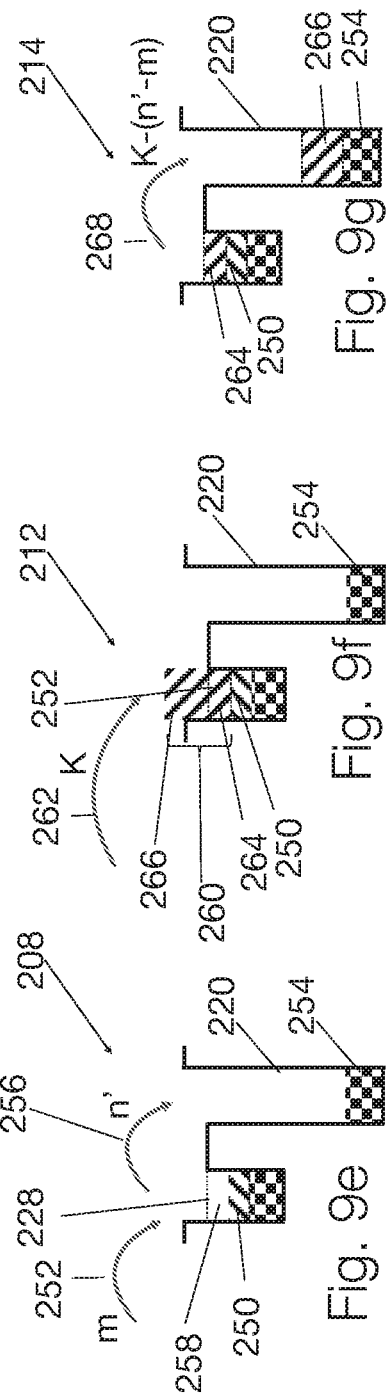

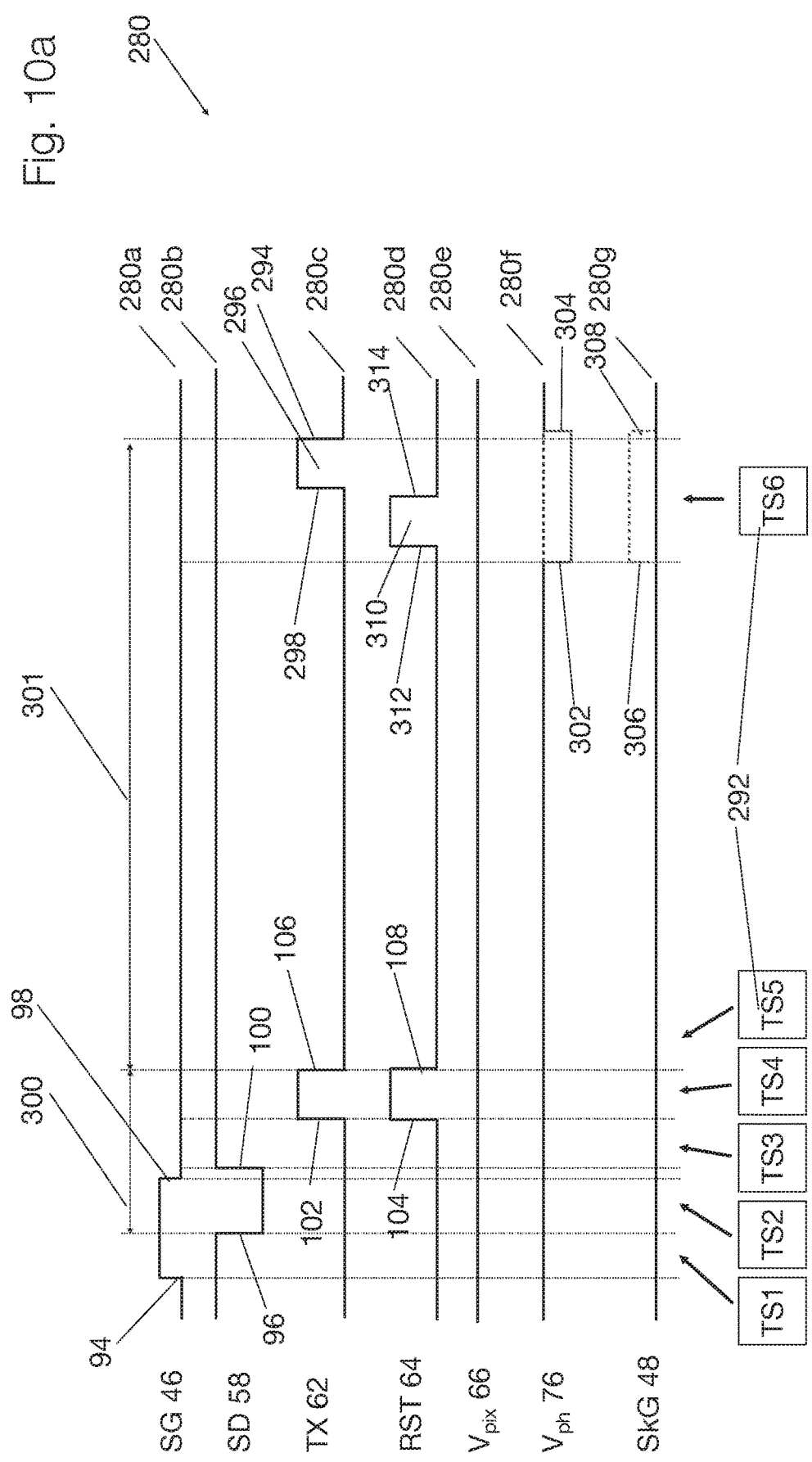

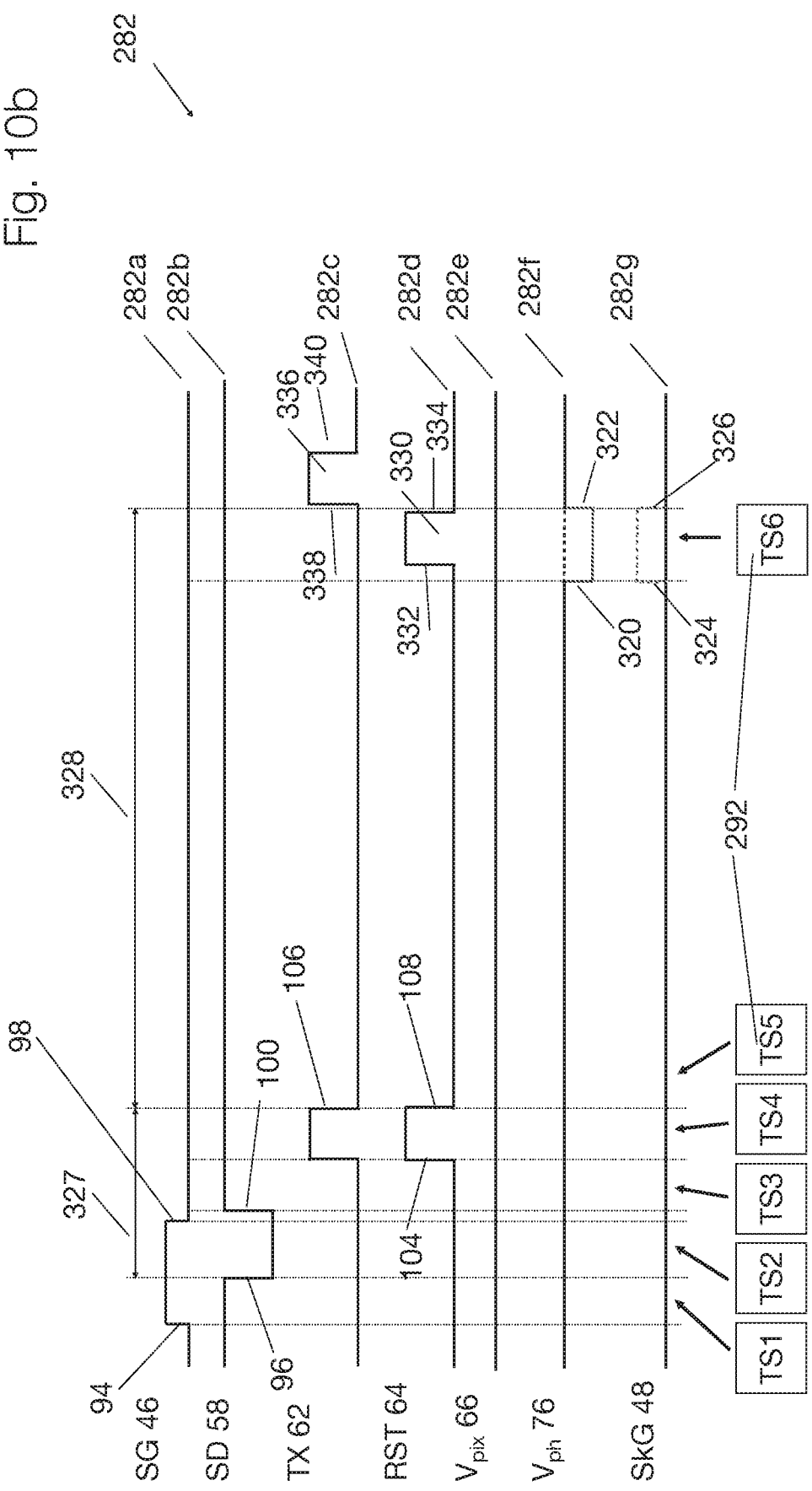

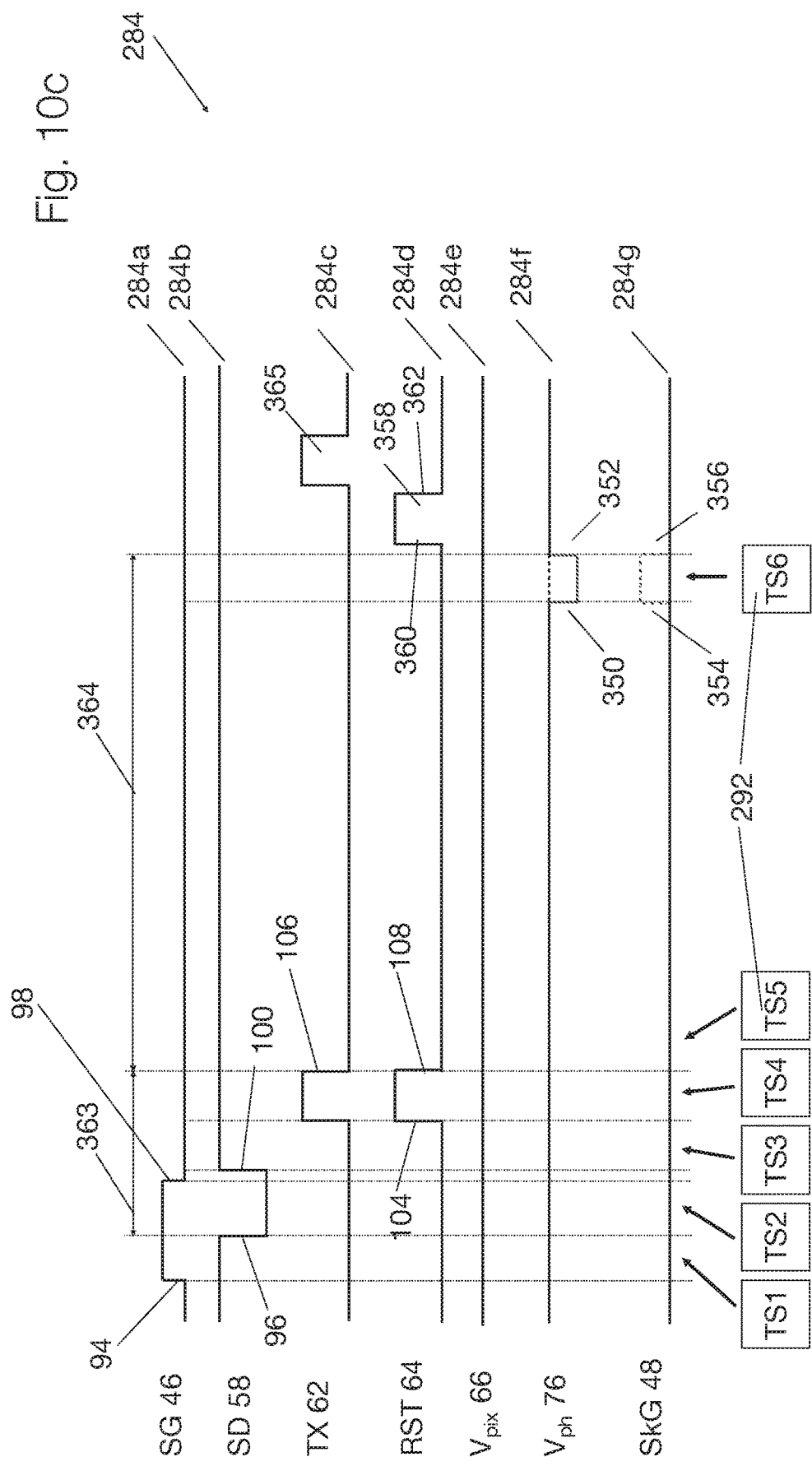

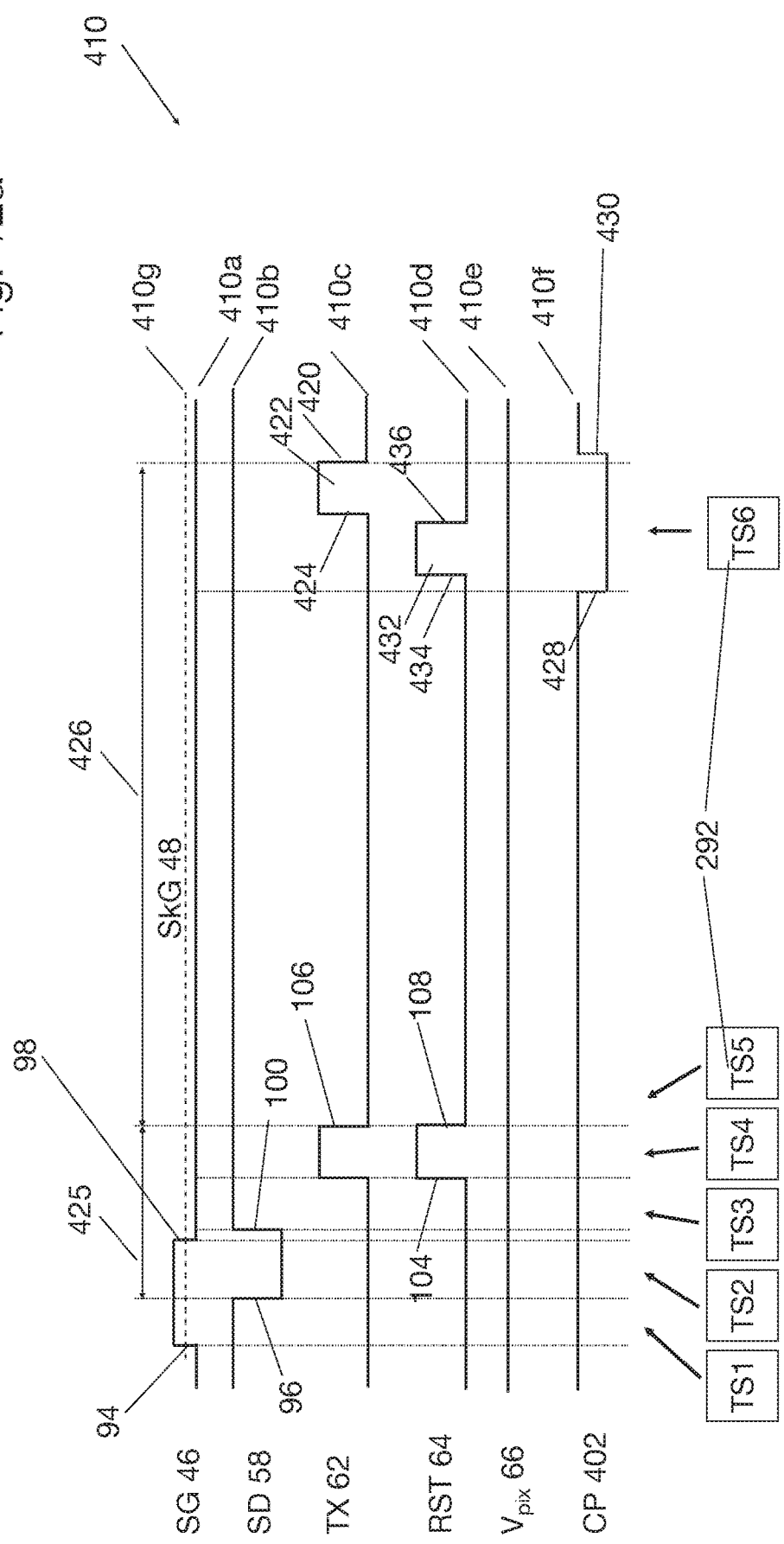

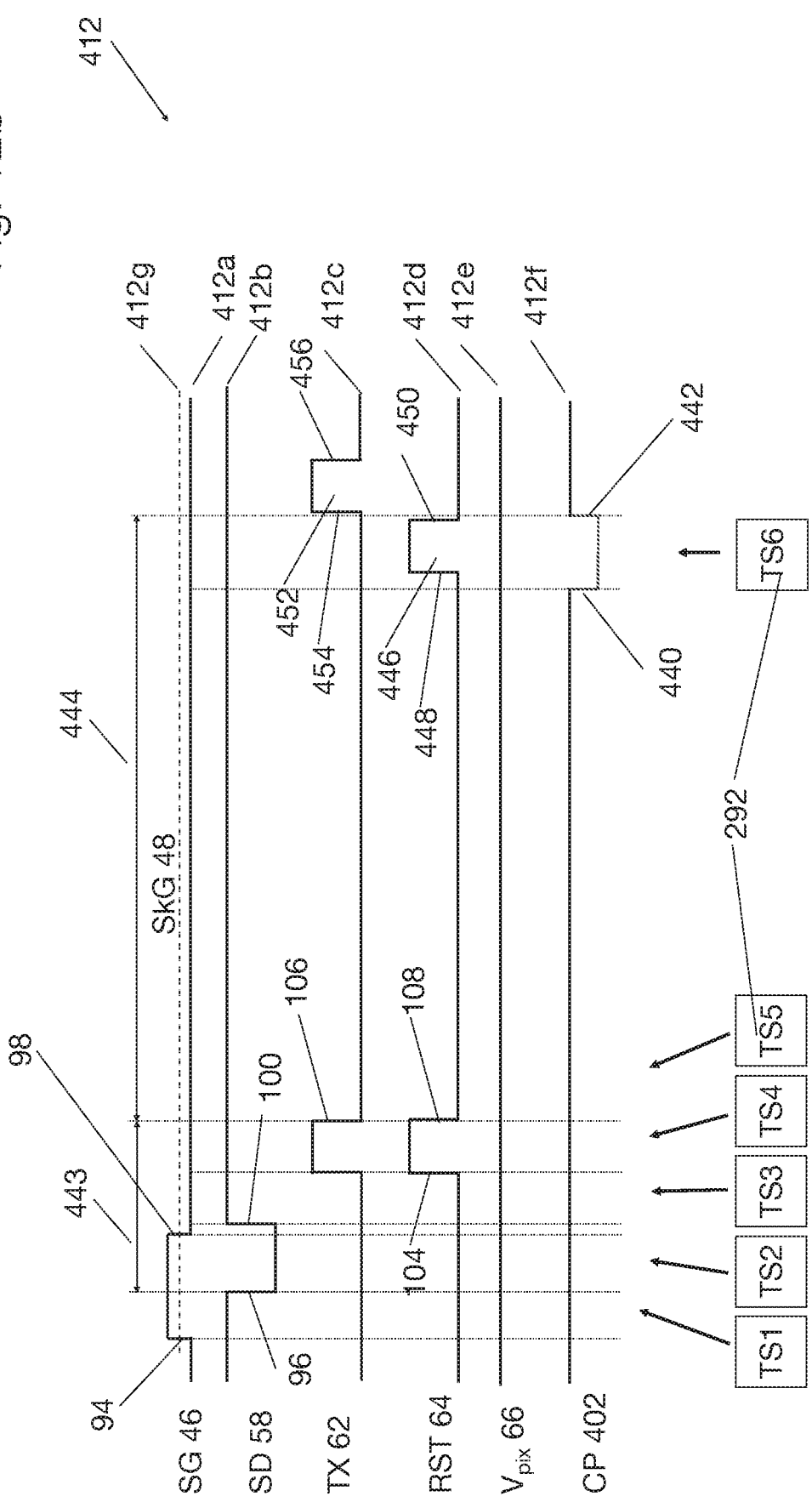

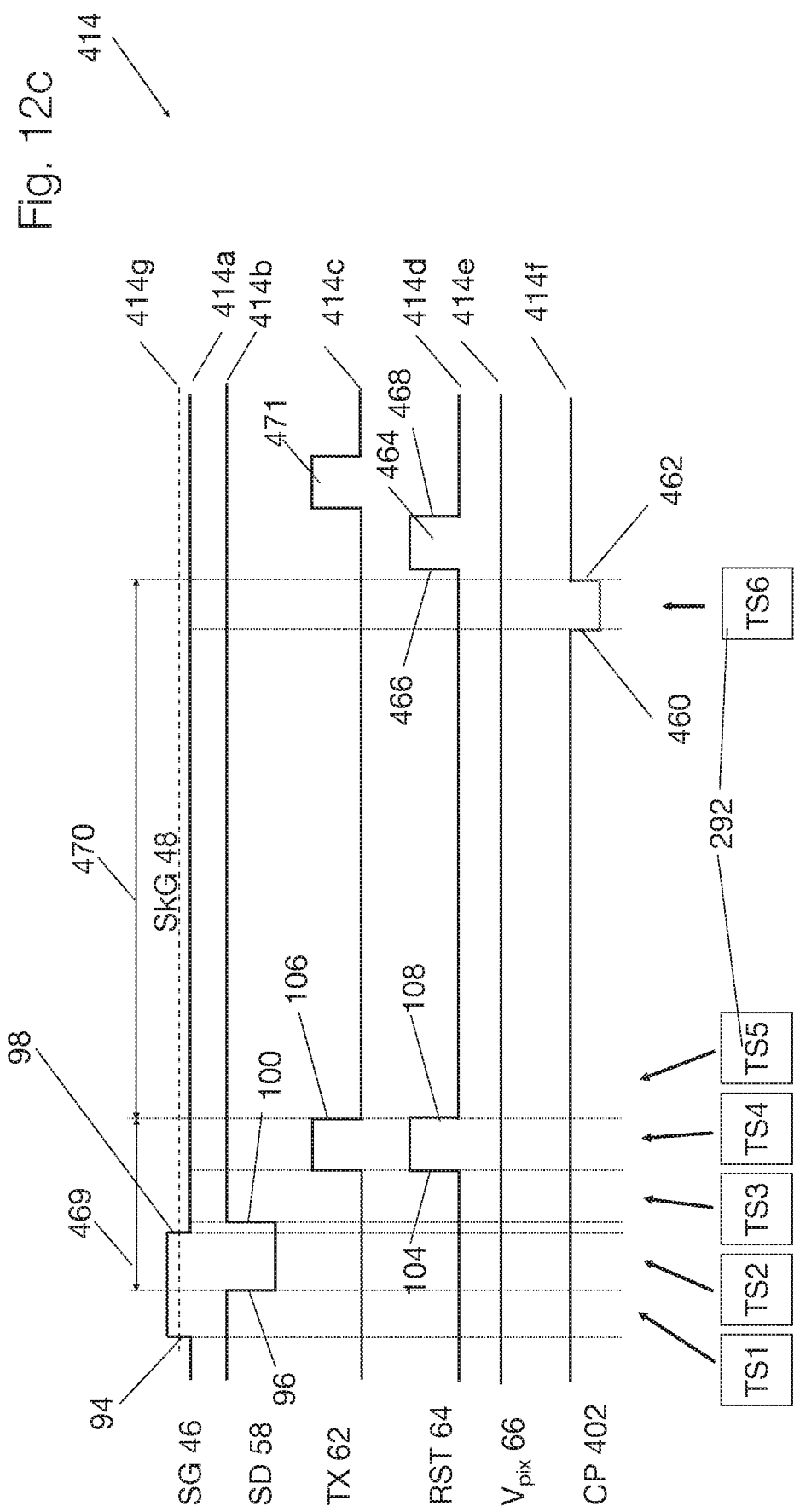

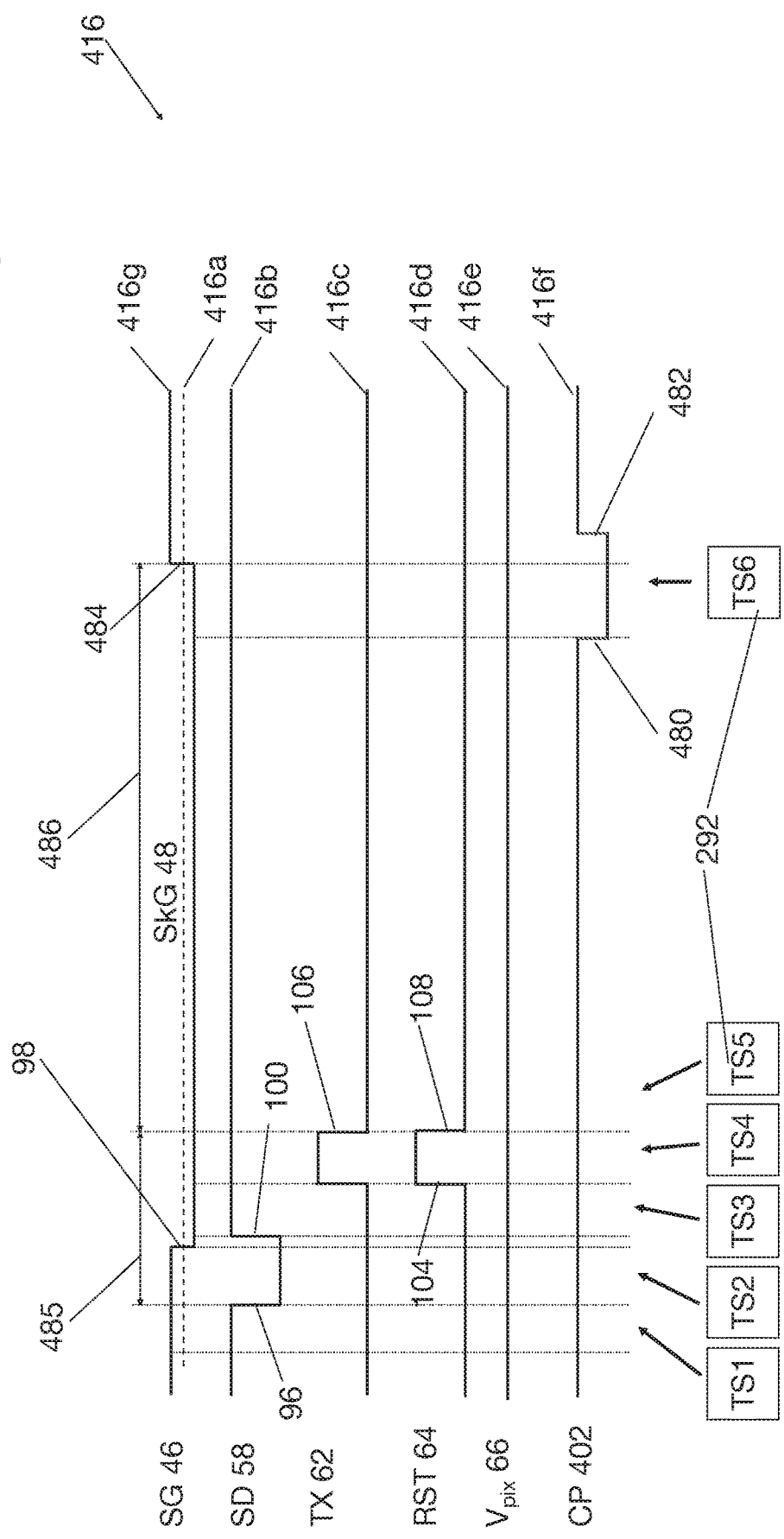

HYBRID IMAGE SENSORS WITH IMPROVED CHARGE INJECTION EFFICIENCY

FIELD OF THE INVENTION

The present invention relates generally to electronic devices, and particularly to image sensors.

BACKGROUND

Hybrid image sensors have a photosensitive layer overlaid on and connected to a readout integrated circuit (ROIC) on a silicon chip. For example, the photosensitive layer may comprise a photosensitive film, such as a film containing quantum dots (known as a quantum film). Such sensors often suffer from lack of charge injection efficiency, resulting in non-linearity, lag and non-uniformity of response to incident light.

A typical structure of a hybrid image sensor comprises a photosensitive layer, top and bottom electrodes, and an ROIC. The photosensitive layer can be designed, for example, as a blanket photo-resistive layer with linear signal output as a function of an applied voltage, or with non-linear response to the applied voltage, similar to a photodiode response. The top electrode on the photosensitive layer is typically common for all pixels of the array and transparent to the incoming light. Each pixel has its own bottom electrode. These electrodes are connected to the front-end circuitry of pixels in the ROIC. Pixels in the photosensitive layer can be separated by pixel isolation, which defines the size and pitch of photosensitive pixels in the array. Alternatively, the photosensitive layer can be designed as a continuous blanket layer of photosensitive material. In this case, pixel pitch is defined by the pitch of the bottom electrodes on the photosensitive layer.

SUMMARY

Embodiments of the present invention that are described herein below provide improved image sensors.

There is therefore provided, in accordance with an embodiment of the invention, imaging apparatus, including a photosensitive medium configured to convert incident photons into charge carriers, and a bias electrode, which is at least partially transparent, overlying the photosensitive medium and configured to apply a bias potential to the photosensitive medium. An array of pixel circuits is formed on a semiconductor substrate. Each pixel circuit defines a respective pixel and includes a pixel electrode coupled to collect the charge carriers from the photosensitive medium; a readout circuit configured to output a signal indicative of a quantity of the charge carriers collected by the pixel electrode; a skimming gate coupled between the pixel electrode and the readout circuit; and a shutter gate coupled in parallel with the skimming gate between a node in the pixel circuit and a sink site. Control circuitry is coupled to sequentially open and close the shutter gate and the skimming gate of each of the pixels in each of a sequence of image frames so as to apply a global shutter to the array and then to read out the collected charge carriers via the skimming gate to the readout circuit.

In some embodiments, the pixel circuit includes a charge storage node between the skimming gate and the readout circuit, and at least one charge transfer gate that connects to the charge storage node. A reset gate is coupled between the charge transfer gate and a reset potential and configured to reset the charge stored on the charge storage node under control of the control circuitry.

In one embodiment, the at least one charge transfer gate includes a first charge transfer gate coupled between the charge storage node and a further storage node, and a second charge transfer gate connected between the further storage node and the reset gate.

Additionally or alternatively, the control circuitry is configured, in each of the image frames, to actuate one of the gates so as to fill a potential well at the pixel electrode with charge carriers, and then to close the shutter gate, whereby the charge carriers acquired at the pixel electrode from the photosensitive medium is transferred through the skimming gate to the readout circuit. In some embodiments, while the one of the gates is actuated, a potential well of the charge storage node is filled with the charge carriers, and the control circuitry is configured, prior to acquiring the charge carriers, to actuate the reset gate and the at least one charge transfer gate so as to allow the charge carriers to drain from the charge storage node while the charge carriers remain in the potential well at the pixel electrode.

In one embodiment, the one of the gates that is actuated so as to fill the potential well at the pixel electrode is the shutter gate. Alternatively, the one of the gates that is actuated so as to fill the potential well at the pixel electrode is the reset gate.

In some embodiments, the control circuitry is configured, after acquisition of the charge carriers in a potential well at the pixel electrode in each of the image frames, to apply a charge pump signal so as to inject an additional number of charge carriers into the potential well at the pixel electrode before reading out the charge carriers to the readout circuit. In the disclosed embodiments, the charge pump signal is applied to at least one circuit location, selected from a group of locations consisting of the bias electrode and the skimming gate.

In one embodiment, the apparatus includes a charge pump capacitor coupled to the pixel electrode, wherein the charge pump signal is applied to the charge pump capacitor.

Additionally or alternatively, the control circuitry is configured to subtract from the signal that has been read out to the readout circuit a signal level corresponding to the additional number of charge carriers.

In some embodiments, the photosensitive medium includes a photosensitive film, for example at least one photodetector material selected from a first group of materials consisting of elemental semiconductors, compound semiconductors, colloidal nanocrystals, epitaxial quantum wells, epitaxial quantum dots, organic photoconductors, and bulk heterojunction organic photoconductors. Typically, the at least one selected photoconductor material has a device configuration selected from a second group of configurations consisting of photoconductors, p-n junctions, heterojunctions, Schottky diodes, quantum well stacks, quantum wires, quantum dots, phototransistors, and series and parallel connected combinations of these configurations.

There is also provided, in accordance with an embodiment of the invention, imaging apparatus, including a photosensitive medium configured to convert incident photons into charge carriers, and a bias electrode, which is at least partially transparent, overlying the photosensitive medium and configured to apply a bias potential to the photosensitive medium. An array of pixel circuits is formed on a semiconductor substrate. Each pixel circuit defines a respective pixel and includes a pixel electrode coupled to collect the charge carriers from the photosensitive medium; a readout circuit configured to output a signal indicative of a quantity of the charge carriers collected by the pixel electrode; a plurality of gates, including a skimming gate coupled between the pixel electrode and the readout circuit; and a charge storage node between the skimming gate and the readout circuit. Control circuitry is coupled to actuate the gates prior to an acquisition period during each of a sequence of image frames so as to fill a potential well at the pixel electrode with charge carriers, and then following the acquisition period to transfer the charge carriers acquired at the pixel electrode from the photosensitive medium through the skimming gate to the charge storage node for readout by the readout circuit.

In some embodiments, the plurality of gates includes a reset gate coupled between the charge storage node and a reset potential and configured to reset the charge stored on the charge storage node under control of the control circuitry. While the gates are actuated, a potential well of the charge storage node is also filled with the charge carriers, and the control circuitry is configured, prior to acquiring the charge carriers, to actuate the reset gate so as to allow the charge carriers to drain from the charge storage node while the charge carriers remain in the potential well at the pixel electrode. In a disclosed embodiment, the control circuitry is further configured to actuate the reset gate so as to fill the potential well at the pixel electrode with the charge carriers, and then to close the reset gate, whereby the photocharge acquired at the pixel electrode is transferred to the readout circuit. The control circuitry may also be configured to apply a charge pump signal so as to inject an additional number of the charge carriers into the potential well of the pixel electrode after the acquisition of the photocharge but before reading out the charge carriers to the readout circuit.

There is additionally provided, in accordance with an embodiment of the invention, imaging apparatus, including a photosensitive medium configured to convert incident photons into charge carriers, a bias electrode, which is at least partially transparent, overlying the photosensitive medium and configured to apply a bias potential to the photosensitive medium. An array of pixel circuits is formed on a semiconductor substrate. Each pixel circuit defines a respective pixel and includes a pixel electrode coupled to collect the charge carriers from the photosensitive medium; a readout circuit configured to output a signal indicative of a quantity of the charge carriers collected by the pixel electrode; a plurality of gates, including a skimming gate coupled between the pixel electrode and the readout circuit; and a charge storage node between the skimming gate and the readout circuit. Control circuitry is coupled, after acquisition of the charge carriers in a potential well at the pixel electrode in each of a sequence of image frames, to apply a charge pump signal so as to inject an additional number of charge carriers into a potential well at the pixel electrode, and then to actuate the gates so as to transfer the charge carriers acquired at the pixel electrode from the photosensitive medium through the skimming gate to the charge storage node for readout by the readout circuit.

In a disclosed embodiment, the apparatus includes a charge pump capacitor coupled to the pixel electrode, wherein the charge pump signal is applied to the charge pump capacitor.

The present invention will be more fully understood from the following detailed description of the embodiments thereof, taken together with the drawings in which:

BRIEF DESCRIPTION OF THE DRAWINGS

FIGS. 5a-f are plots that schematically illustrate electrical potential and charge levels across a pixel in a hybrid image sensor at successive stages in the Charge Leveling operation of FIG. 4, in accordance with an embodiment of the invention;

FIG. 6 is a timing diagram that schematically illustrates a Charge Leveling operation, in accordance with another embodiment of the invention;

FIGS. 7a-f are plots that schematically illustrate electrical potential and charge levels across a pixel in a hybrid image sensor at successive stages in the Charge Leveling operation of FIG. 6, in accordance with an embodiment of the invention;

FIGS. 8a-g are plots that schematically illustrate electrical potential and charge levels across a pixel in a hybrid image sensor at successive stages in a process of Assisted Direct Injection (ADI), in accordance with an embodiment of the invention;

FIGS. 9a-g are plots that schematically illustrate electrical potential and charge levels across a pixel in a hybrid image sensor at successive stages in a process of ADI, in accordance with another embodiment of the invention;

FIGS. 10a-d are timing diagrams that schematically illustrate processes of ADI, in accordance with embodiments of the invention;

FIGS. 12a-d are timing diagrams that schematically illustrate processes of ADI using a dedicated charge-pump capacitor, in accordance with embodiments of the invention.

DETAILED DESCRIPTION OF EMBODIMENTS

To enhance the acquisition of photo-induced charge in the ROIC, some hybrid image sensor designs use direct injection of photocurrent into the pixel circuit of each pixel in the ROIC through an input transistor (also called a skimming gate) and further accumulation of charge at elements of the pixel circuit. The skimming gate stabilizes the voltage across the photosensitive film during acquisition, and enables a global shutter mode of operation by directing current to different accumulating sites in pixel circuit.

A problem with direct injection through the skimming gate is related to parasitic capacitance of the input node of the ROIC that is connected to the photosensitive element, and depletion of this parasitic capacitance during sensor operation. The skimming gate transistor operates in a sub-threshold mode, resulting in a very long time of settling of the voltage on the input node of the pixel circuit, low current injection efficiency, and lag. The settling speed strongly depends on the level of photocurrent and/or dark current coming from the photosensitive element. As a result, with different photocurrent levels, the number of electrons injected into the pixel circuit during integration time may not be proportional to the total current from the photosensitive element. Therefore, the sensor photo-response curve will be nonlinear.

Embodiments of the present invention that are described herein provide methods and apparatus to mitigate these problem using an improved mode of charge injection through the skimming gate, herein called "Assisted Direct Injection" (ADI). ADI does not require a complicated pixel circuit, and can be applied to hybrid image sensors with both global and rolling shutter pixel architectures. Although the description below relates specifically to global shutter sensors, ADI techniques can similarly be applied, mutatis mutandis, to rolling shutter sensors, as well.

Figure 1:
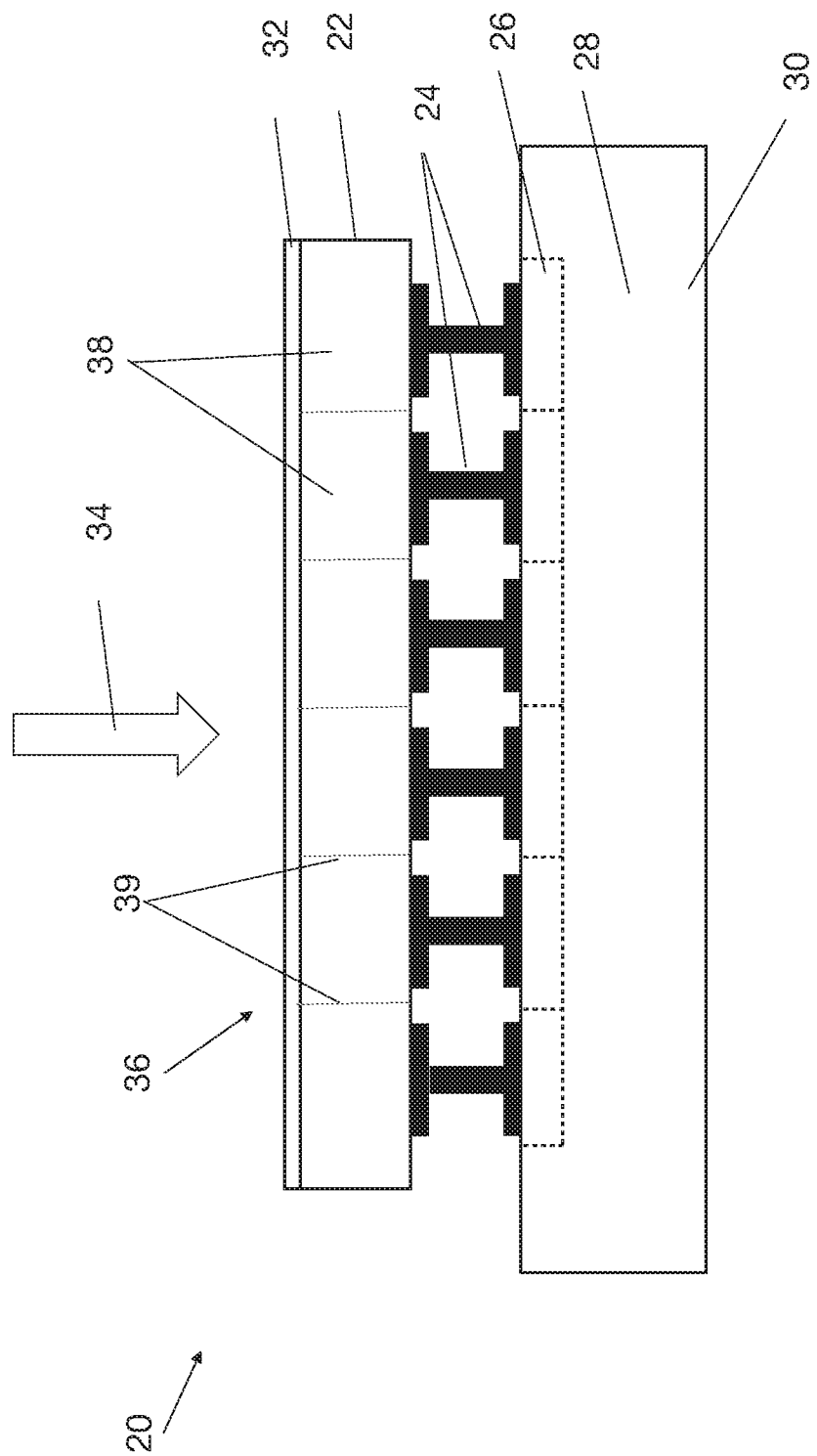
FIG. 1 is a schematic sectional view of a hybrid image sensor, in accordance with an embodiment of the invention.

FIG. 1 is a schematic sectional view of a hybrid image sensor 20, in accordance with an embodiment of the invention. Hybrid image sensor 20 comprises a photosensitive medium, for example a photosensitive film 22, which converts the incident photons, indicated by an arrow 34, into charge carriers (photocharge). Photosensitive film 22 is coupled by bottom electrodes 24 to pixel circuit 26, which is a part of a read-out integrated circuit (ROIC) 28. Both pixel circuit 26 and other elements of ROIC 28 are manufactured by known methods for manufacturing semiconductor integrated circuits, for example a CMOS process, on a silicon substrate 30. Photosensitive film 22 is covered by a top electrode 32, which is transparent to the incoming light. Top electrode 32 functions as a bias electrode for hybrid image sensor 20. Although FIG. 1 shows a single top electrode 32 over all of the pixels of image sensor 20, in alternative embodiments (not shown in the figures), the image sensor may comprise multiple top electrodes, each covering an individual pixel or group of pixels.

Photosensitive film 22 in the present example comprises a continuous blanket layer of photosensitive material. Photosensitive film 22 may comprise, for example, elemental semiconductors, compound semiconductors, colloidal nanocrystals, epitaxial quantum wells, epitaxial quantum dots, organic photoconductors, and bulk heterojunction organic photoconductors. These materials may be hybrid-bonded to hybrid image sensor 20, and may form, for example, photoconductors, p-n junctions, heterojunctions, Schottky-diodes, quantum well stacks, quantum wires, quantum dots, phototransistors, as well as combinations of these devices connected in series and parallel. Hybrid image sensor 20 comprises a photodetector array 36 comprising pixels 38, wherein the pixel pitch is defined by the pitch of bottom electrodes 24 on photosensitive film 22, as indicated by dotted lines 39. Bottom electrodes 24 are separate for different pixels 38, and they are connected to pixel circuit 26 of ROIC 28. Alternatively or additionally, pixels 38 in photosensitive film 22 can be separated by pixel isolation (not shown), which defines the size and pitch of the pixels in array 36. Top electrode 32, comprising indium tin oxide, for example, can be common for all pixels 38 of array 36.

Figure 2:
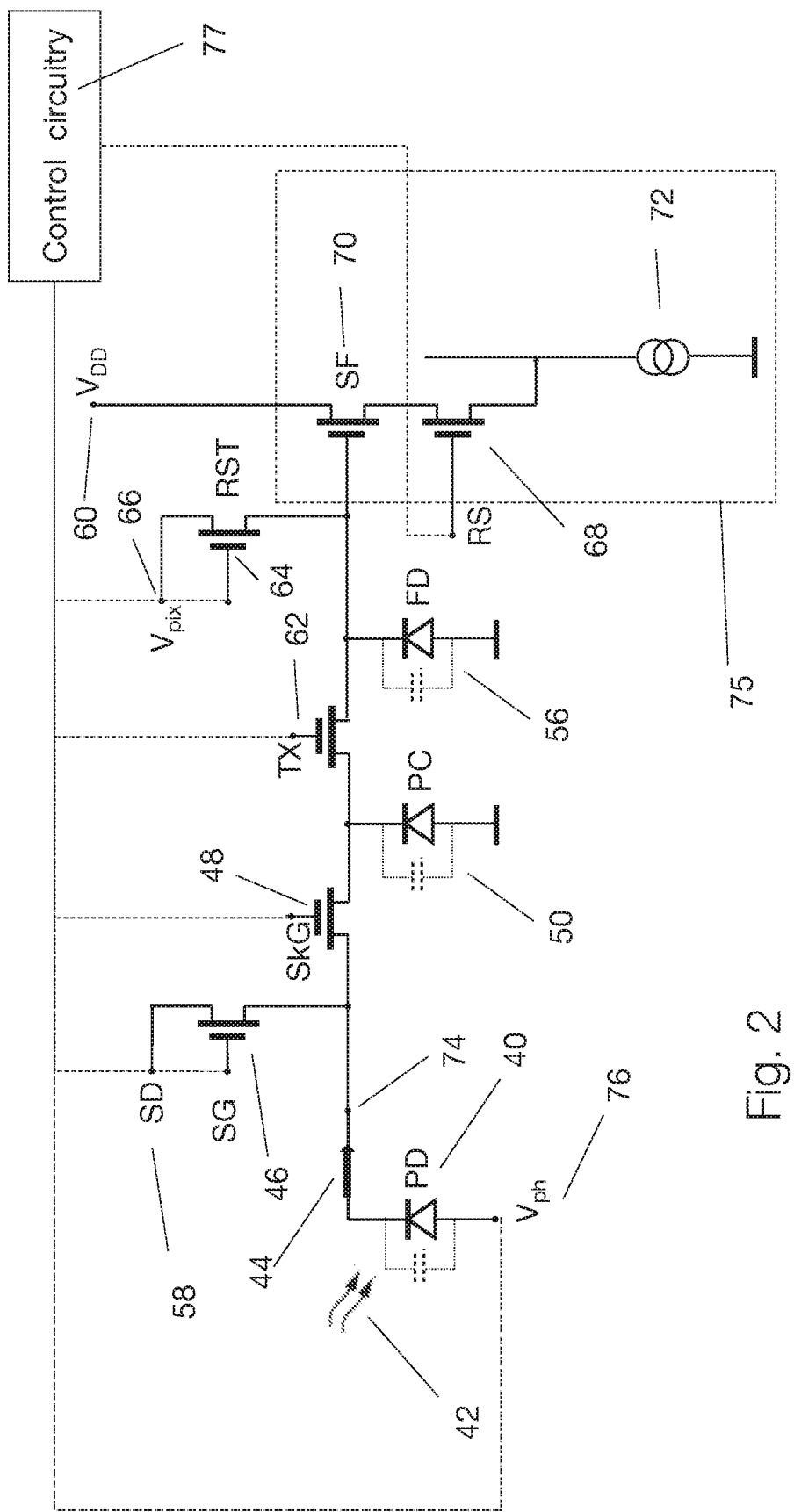
FIG. 2 is a schematic circuit diagram of a 6T global shutter pixel architecture for a hybrid image sensor, in accordance with an embodiment of the invention.

FIG. 2 is a schematic circuit diagram of a 6T global shutter pixel architecture for hybrid image sensor 20, in accordance with an embodiment of the invention. This architecture is referred to as a 6T architecture (six-transistor architecture) and will be used in illustrating the operation of the ADI techniques that are described hereinbelow. FIG. 2 shows the structure of a single pixel, which is typically duplicated in all the photodetectors of array 36.

A photodetector (PD) 40, such as the corresponding area of pixel 38 in photosensitive film 22, receives photons 42 and emits a corresponding photoelectron current 44. A collective action of a shutter transistor (SG) 46 and a skimming gate (SkG) 48 allows the charge from PD 40 to be either collected and stored on a pinned collector (PC) 50, used as a charge storage node, or to be sinked to a sink site, such as the power supply of a sink voltage (SD) 58. During the integration time, photoelectron current 44 is directed via SkG 48 to PC 50. During shutter time, on the other hand, photoelectron current 44 is directed via SG 46 to SD 58.

Readout of charges stored on PC 50 can be performed using a correlated double sampling (CDS) technique, which cancels kTC noise (reset noise of capacitors) of a floating diffusion (FD) 56.

Additional voltages and components in the circuitry of FIG. 2 include a baseline voltage ($V_{DD}$) 60, a transfer gate (TX) 62, a reset gate (RST) 64, a reset voltage ($V_{pix}$) 66, and a bias voltage ($V_{ph}$) 76. A row select gate (RS) 68, a source follower gate (SF) 70, and a source follower current source 72 are parts of a readout circuit 75.

PD 40 is connected to the circuitry at an input node 74. Input node 74 is the location in the circuitry where pixel electrode 24 is connected to photosensitive film 22 (FIG. 1).

Control circuitry 77 is coupled to control the gates and voltages of the circuitry of FIG. 2. As one of its functions, control circuitry 77 sequentially opens and closes SG 46 and SkG 48 of each of pixels 38, as part of the ADI operations that are described further hereinbelow. Control circuitry 77 performs these functions in each of a sequence of image frames recorded by photodetector array 36 in order to apply a global shutter to the array and then to read out the collected charge carriers via SkG 48 to readout circuit 75.

ADI techniques in accordance with embodiments of the invention are described specifically, for the sake of concreteness and clarity, with reference to the pixel architecture of FIG. 2. Alternatively, these techniques may be applied to other 6T architectures, as well as to 5T, 7T and other pixel architectures that are known in the art.

Figure 3:
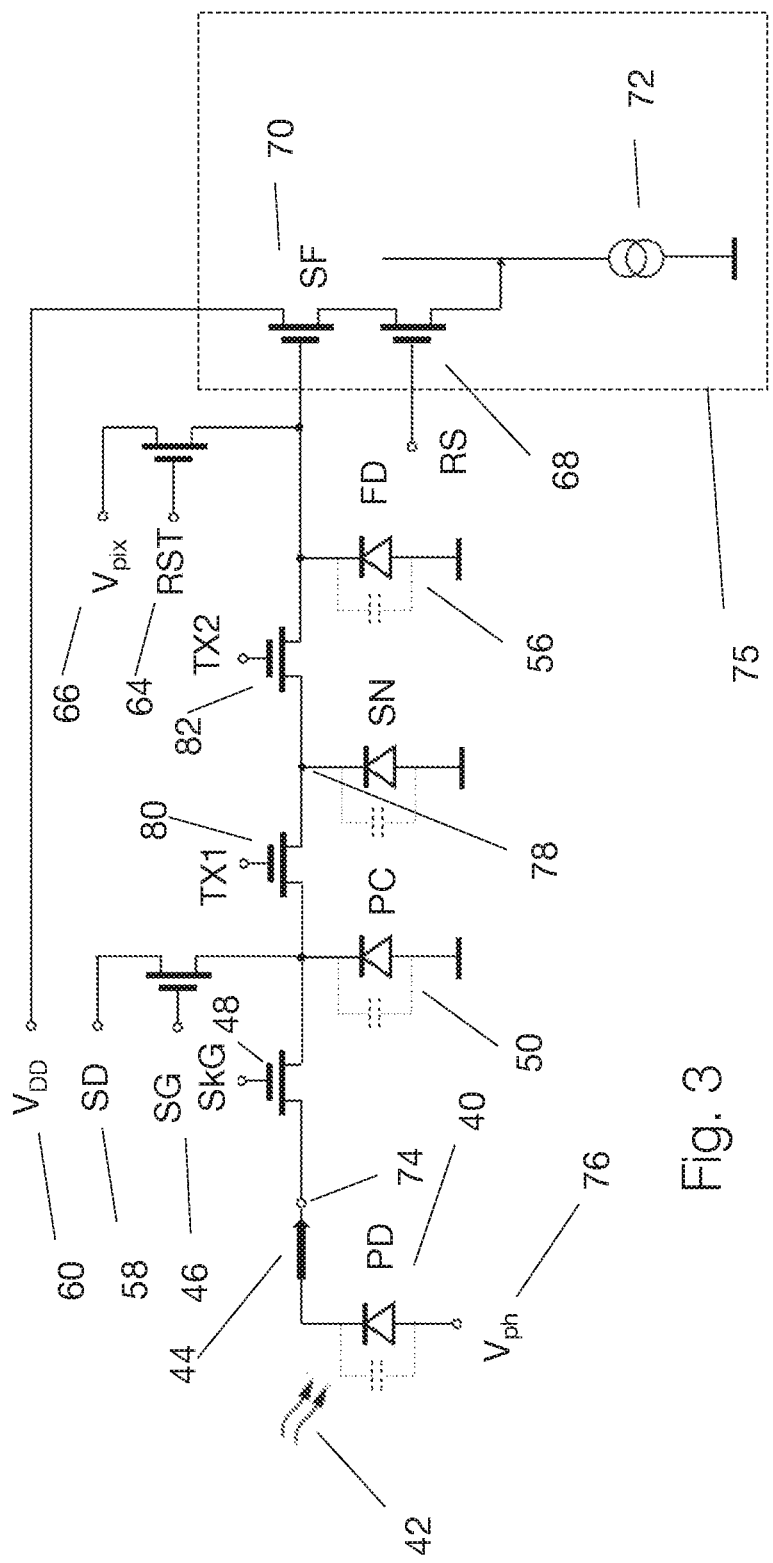
FIG. 3 is a schematic circuit diagram of a 7T global shutter pixel architecture for a hybrid image sensor, in accordance with another embodiment of the invention.

FIG. 3 is a schematic circuit diagram of a 7T global shutter pixel architecture for hybrid image sensor 20, in accordance with another embodiment of the invention. Components substantially identical to those in FIG. 2 are labelled with the same labels as in that figure.

In the disclosed embodiment SG 46 is placed behind the transistor of SkG 48 (i.e., on the far side of SkG 48 from input node 74). The ADI techniques described below are fully applicable to this 7T pixel architecture, as well. In this embodiment, SG 46 can perform an anti-blooming (AB) function in addition to shutter operation. The charge from PC 50 is transferred first to a charge storage node (SN) 78, and is then read out from the SN using a CDS technique similar to that used in FIG. 2. The circuitry includes two transfer gates, TX1 80 and TX2 82. A control circuit, similar to control circuit 77 of FIG. 2, is coupled to the gates of FIG. 3, but has been omitted from FIG. 3 for the sake of simplicity.

As was mentioned above, the challenge in direct injection of photoelectron current to the pixel circuit through a skimming gate is related to parasitic capacitance of input node 74, and its depletion during different phases of sensor operation. The ADI technique includes two stages that address this challenge:

Charge Leveling operation to set the voltage on input node 74 and charge the parasitic capacitance of the input node to the potential beneath SkG 48. This operation is done before starting acquisition of photoelectron current 44 on PC 50.

Charge Pump at the end of integration time and before reading the signal value, to compensate for the charge on PC 50 that was induced by depletion of the parasitic capacitance of input node 74 during integration time.

These two operations, performed for each of the image frames under the control of control circuitry 77, will now be described in further detail. Although it can be particularly advantageous to perform both of these stages in succession, as described below, it alternative embodiments of the present invention, either one of the two operations—Charge Leveling and Charge Pump—may be performed individually without the other.

Charge Leveling Operation—Embodiment 1

Figure 4:
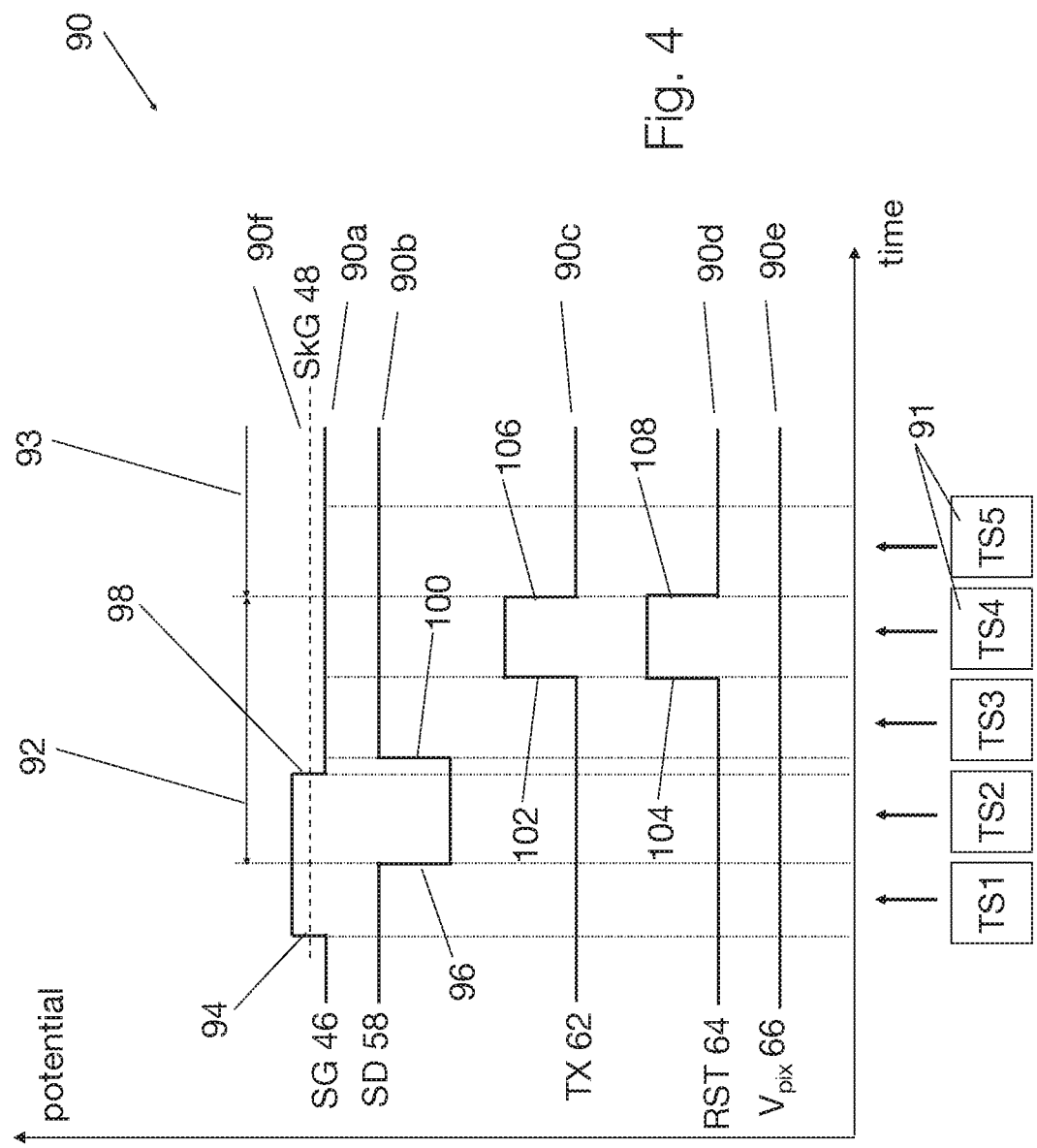
FIG. 4 is a timing diagram that schematically illustrates a Charge Leveling operation, in accordance with an embodiment of the invention.

FIG. 4 is a timing diagram 90 that schematically illustrates a Charge Leveling operation, in accordance with an embodiment of the invention. Timing diagram 90 shows potentials at selected locations against a horizontal time axis in the 6T global shutter pixel architecture shown in FIG. 2. Timing diagram 90 comprises six curves 90a-f showing the following potentials:

Curve 90a shows the potential at SG 46.
Curve 90b shows the potential at SD 58.
Curve 90c shows the potential at TX 62.
Curve 90d shows the potential at RST 64.
Curve 90e shows the potential at $V_{pix}$ 66.
Curve 90f shows the potential at SkG 48.

For the sake of clarity, curves 90a-f have been individually shifted in the vertical direction, and do not refer to a common zero potential. Time stamps 91 on the time axis as well as other details of FIG. 4 will be described below.

FIGS. 5a-f schematically illustrate electrical potential and charge levels across a pixel in hybrid image sensor 20 at successive stages in the Charge Leveling operation of FIG. 4, in accordance with an embodiment of the invention. For ease of following the potential curves, FIG. 5a is a schematic sectional view 120 (taken along a section line that is not necessarily straight) of relevant parts of pixel circuit 26 in the 6T global shutter pixel architecture shown in FIG. 2. FIGS. 5b-5f show plots 122, 124, 126, 128, and 130 of potentials at selected locations in circuitry 26, aligned horizontally with the circuit elements of FIG. 5a. These figures refer to the case in which SG 46 and SkG 48 are n-MOS transistors. In FIGS. 5b-f, positive (high) potential is down.

The Charge Leveling operation is applied before the start of integration time. (Integration time will be detailed later.)

In FIG. 4, the duration of the Charge Leveling operation is denoted by a double arrow 92, and the initial part of integration time is denoted by an arrow 93. The Charge Leveling operation is described here at five instances of time, denoted by time stamps 91 (TS1-TS5):

1) At a time stamp TS1 the shutter of the circuit is turned on by applying to SG 46 a voltage higher than the potential of SkG 48, and by keeping the voltage on SD 58 at a high level. The rise of the potential at SG 46 is shown in FIG. 4 by a rising edge 94. photoelectron current 44 from PD 40 flows to SD 58, as shown in FIG. 5b by an arrow 132. Electrical charge 134 is shown in FIG. 5b, as well as in FIGS. 5c-f, by hatching.

2) At a time stamp TS2 the potential of SD 58 is brought to a low level, as shown by a falling edge 96 in FIG. 4. The potential wells of input node 74, SkG 48, and PC 50 are filled with charge 134, as shown in FIG. 5c.

3) At a time stamp TS3 the potential of SG 46 is set lower than the potential of SkG 48, as shown by a falling edge 98 in FIG. 4. After that, the potential of SD 58 is brought back to a high level, as shown by a rising edge 100 in FIG. 4. As shown in FIG. 5d, potential wells of input node 74, SkG 48, and PC 50 are still filled with charge 134 to the level determined previously by the low voltage of SD 58.

4) At a time stamp TS4 transistors TX 62 and RST 64 are opened, as shown in FIG. 4 by rising edges 102 and 104, respectively. Charge 134 from the potential wells of SkG 48 and PC 50 is spilled into the power supply of $V_{pix}$ 66, as indicated by arrows 136 in FIG. 5e.

5) At a time stamp TS5, TX 62 and RST 64 close, as shown in FIG. 4 by falling edges 106 and 108, respectively. As shown in FIG. 5f, the potential well of input node 74 is filled to the level of the barrier under SkG 48 (with accuracy determined by the value of the kTC noise of the capacitance of the input node). The potential of input node 74 is restored to its initial value, lag is erased, and the pixel is ready to integrate additional photoelectron current 44 from photodetector 40 on PC 50.

Charge Leveling Operation—Embodiment 2

In this embodiment, both the fill and spill stages are performed using the path of TX 62 and RST 64 in the 6T global shutter pixel architecture shown in FIG. 2. This path fills the potential wells from $V_{pix}$ 66 rather than from SD 58 as in the previous embodiment.

FIG. 6 is a timing diagram 140 that schematically illustrates a Charge Leveling operation, in accordance with another embodiment of the invention. Timing diagram 140 shows potentials at selected locations against a horizontal time axis in the 6T global shutter pixel architecture shown in FIG. 2. Similarly to timing diagram 90, timing diagram 140 comprises six curves 140a-f showing the following potentials:

Curve 140a shows the potential at SG 46.
Curve 140b shows the potential at SD 58.
Curve 140c shows the potential at TX 62.
Curve 140d shows the potential at RST 64.
Curve 140e shows the potential at $V_{pix}$ 66.
Curve 140f shows the potential at SkG 48.

As in FIG. 4, curves 140a-f have been individually shifted in the vertical direction, and do not refer to a common zero potential. Time stamps 142 on the time axis as well as other details of FIG. 6 will be described below.

FIGS. 7a-f schematically illustrate electrical potential and charge levels across a pixel in hybrid image sensor 20 at successive stages in the Charge Leveling operation of FIG. 6, in accordance with an embodiment of the invention. For ease of following the potential curves, FIG. 7a, identical to FIG. 5a, is a schematic sectional view 160 of relevant parts of pixel circuit 26 in the 6T global shutter pixel architecture shown in FIG. 2. FIGS. 7b-7f show plots 162, 164, 166, 168, and 170 of potentials at selected locations in circuitry 26, aligned horizontally with the circuit elements of FIG. 7a. These figures refer to the case in which SG 46 and SkG 48 are n-MOS transistors. In FIGS. 7b-f, positive (high) potential is down.

In FIG. 6, the Charge Leveling operation is denoted by a double arrow 141, and the initial part of integration time is denoted by an arrow 143. The Charge Leveling operation is described here at five instances of time, denoted by time stamps 142 (TS1-TS5):

1) At time stamp TS1 the shutter of the circuit is turned on by applying to SG 46 a voltage higher than the potential of SkG 48, and by keeping the voltage on SD 58 at a high level. The rise of the potential at SG 46 is shown in FIG. 6 by a rising edge 144. photoelectron current 44 from PD 40 flows to SD 58, as shown in FIG. 7b by an arrow 172. Electrical charge 174 is shown in FIG. 7b, as well as in FIGS. 7c-f, by hatching.

2) At time stamp TS2 the shutter of the circuit is turned off by returning the potential of SG 46 to a level lower than the potential of SkG 48, as shown in FIG. 6 by a falling edge 146.

3) At time stamp TS3 transistors TX 62 and RST 64 are opened, as shown in FIG. 6 by rising edges 148 and 150, respectively. Immediately after that, the potential of $V_{pix}$ 66 is brought to a lower level, as shown in FIG. 6 by a falling edge 152. This fills the potential wells of input node 74, PC 50, SkG 48, and FD 56 from $V_{pix}$ 66, as is shown in FIG. 7d.

4) At time stamp TS4 the potential of $V_{pix}$ 66 is brought back to its previous level, as shown in FIG. 6 by a rising edge 154, stopping the flow of charge from $V_{pix}$ 66. Charge 174 is spilled back into $V_{pix}$ 66, as shown in FIG. 7e by arrows 178, leaving the potential well of input node 74 filled to the level of the potential of SkG 48.

5) At time stamp TS5 gates TX 62 and RST 64 close, as shown in FIG. 6 by falling edges 156 and 158 and in FIG. 7f, and the pixel is ready to integrate additional photoelectron current 44.

Without the Charge Leveling operation, photoelectron current 44 from photodetector PD 40 would have to fill the depleted potential well of input node 74 before going to the accumulation side, thus reducing injection efficiency, and creating lag and non-linearity of signal response. As a result of the Charge Leveling operations described above, the potential well of input node 74, despite depletion by switching SG 46 and/or by escaped electrons during the previous readout cycle, is filled with electrons to the level of the barrier under SkG 48. Photoelectron current 44 from photodetector 40 can flow immediately through SkG 48 and can be acquired on PC 50, thus bringing injection efficiency to a high, consistent level.

Charge Pump

Referring to the 6T global shutter pixel architecture shown in FIG. 2, the second stage of ADI operation, Charge Pump, is intended to compensate for depletion of the potential well of input node 74 during integration time. When photoelectron current 44 from photodetector 40 is zero or very low, electrons can escape from the potential well of input node 74 through skimming gate SkG 48, and be acquired at PC 50, with the escaping electrons creating a depletion in the potential well. Any photoelectron current 44 must first go to the depleted potential well of input node 74, thus jeopardizing injection efficiency, and creating signal non-linearity. Consequently, charge acquired on PC 50 will no longer correctly represent photoelectron current 44.

The Charge Pump operates by applying a small-amplitude negative voltage pulse as a charge pump signal to a common electrode of photodetector array 36, thus forcing an additional number of charge carriers, a so-called pump charge, to be injected into the potential well of input node 74. This injected pump charge compensates for the depletion of the potential well of input node 74, and restores the value of charge acquired on PC 50 to the correct value representing photoelectron current 44. The resulting charge acquired on PC 50 is equal to the integrated photoelectron current 44 plus the additional pump charge injected during Charge Pump operation. This additional charge is the same for all pixels of photodetector array 36, including optical black pixels, as well (pixels that are covered and do not receive any optical radiation), and will be removed from the output signal by a black level calibration (BLC) procedure that is commonly used in modern image sensor designs. In the BLC procedure, control circuitry 77 subtracts from the signal that has been read out to readout circuit 75 a signal level corresponding to the additional number of charge carriers injected in the pump charge.

FIGS. 8a-g are plots that schematically illustrate electrical potential and charge levels across a pixel in hybrid image sensor 20 at successive stages in a process of Assisted Direct Injection (ADI), in accordance with an embodiment of the invention.

FIGS. 9a-g are plots that schematically illustrate electrical potential and charge levels across a pixel in hybrid image sensor 20 at successive stages in a process of ADI, in accordance with another embodiment of the invention.

FIGS. 8a-g present an embodiment wherein no current flows from photodetector PD 40 during Charge Pump operation (neither dark current nor photoelectron current 44), whereas FIGS. 9a-g present an embodiment wherein a dark current and/or a very low photocurrent flows from the photodetector.

Both FIGS. 8a-g and 9a-g show schematic plots of the distribution of electrical charge across the potential wells of PD 40, SkG 48, and PC 50 in the 6T global shutter pixel architecture shown in FIG. 2, at the times of selected events of Charge Leveling, integration, and Charge Pump operation. For ease of following the potential curves, FIGS. 8a and 9a are identical schematic sectional views 222 of relevant parts of pixel circuit 26 in the 6T global shutter pixel architecture shown in FIG. 2. FIGS. 8b-g show plots 184, 186, 188, 190, 194, and 196, respectively, and FIGS. 9b-g show plots 202, 204, 206, 208, 212, and 214, respectively. As the potentials of PD 40, SkG 48, and PC 50 are constant between the selected events, a curve 220 of potential across these locations is identical for all plots in FIGS. 8b-g and 9b-g.

FIGS. 8b and 9b include axes for location and potential. For the sake of simplicity, these axes are omitted in FIGS. 8c-g and 9c-g.

As FIGS. 8a-g present an embodiment wherein no current flows from photodetector 40 (neither dark current nor photocurrent 44), one would expect to see a zero charge acquired on PC 50 during integration time.

FIG. 8b shows an initial stage, wherein the potential well of input node 74 is partially filled with a charge 223.

FIG. 8c shows an intermediate stage of Charge Leveling, similar to FIG. 5d.

FIG. 8d shows the end result of the Charge Leveling operation: The potential of input node 74 is restored to its initial value, and charge 223 has filled the potential well of the input node to the level of the potential barrier under SkG 48. After the completion of the Charge Leveling operation, the integration starts.

FIG. 8e shows the status after integration: Although no electrons flow from PD 40 during the entire period of integration, n electrons 224 have escaped from charge 223 in the potential well of input node 74 through the potential barrier of SkG 48, as shown by an arrow 226. These n electrons have been acquired on PC 50, and a depleted space 229 for n electrons is left under a dotted line 228, which denotes the potential barrier of SkG 48.

FIG. 8f shows with an arrow 232 the injection of a pump charge 230 of K electrons through SkG 48 into input node 74 during Charge Pump operation at the end of the integration period. Of pump charge 230, n "new" electrons 234 fill depleted space 229 left under the potential barrier of SkG 48 (dotted line 228), and the remaining K-n electrons 236 are above the potential barrier of SkG.

FIG. 8g shows how K-n electrons 236 have flowed, as shown by an arrow 238, into the potential well of PC 50. K-n electrons 236 and n electrons 224 (already in the potential well) combine to give a total charge of K electrons on PC 50. After black level calibration (BLC), wherein the injected pump charge 230 of K electrons is removed, the total measured charge is equal to zero, as it should be. BLC utilizes the number of electrons collected in the black pixels as the K electrons for the calibration. Consequently, the black level can be calibrated and subtracted out precisely notwithstanding leakage of electrons through SkG 48.

FIGS. 9a-g present an embodiment wherein a small current (either dark current or photoelectron current 44, or a combination of both) flows from photodetector 40. The stages shown in FIGS. 9b-d are identical to those shown in FIGS. 8b-d.

FIG. 9b shows an initial stage, wherein the potential well of input node 74 is partially filled with a charge 227.

FIG. 9c shows an intermediate stage of Charge Leveling, similar to FIG. 5d.

FIG. 9d shows the end result of the Charge Leveling operation: The potential of input node 74 is restored to its initial value, and charge 227 has filled the potential well of the input node to the level of the barrier under SkG 48. After the completion of the Charge Leveling operation, the integration starts.

FIG. 9e shows the status after integration: m electrons 250 flow from PD 40 during the period of integration, and are acquired in the potential well of input node 74, as shown by an arrow 252. n' electrons 254 have escaped, as shown by an arrow 256, from the potential well of input node 74 through the potential barrier of SkG 48, which is denoted by dotted line 228 as in FIG. 8d. These n' electrons 254 have been acquired on PC 50, and a depleted space 258 for n'-m electrons is left under dotted line 228. n' is in general different from n in the previous embodiment, as the rate of escape through the potential barrier of SkG 48 depends on the current flowing from PD 40.

FIG. 9f shows by an arrow 262 the injection of a pump charge 260 of K electrons into input node 74 during charge pump operation at the end of the integration period. Of pump charge 260, n'-m electrons 264 fill depleted space 258 left under the potential barrier of SkG 48 (dotted line 228), and remaining K-(n'-m) electrons 266 are above the potential barrier of SkG.

FIG. 9f shows how K-(n'-m) electrons 266 have flowed, as shown by an arrow 268, into the potential well of PC 50. K-(n'-m) electrons 266 and n' electrons 254 combine to give a total charge of K+m electrons on PC 50. After BLC, wherein the injected pump charge 260 of K electrons is removed based on the number of electrons collected by the black pixels, the total measured charge is equal to m, i.e. the charge due to either dark current or photoelectron current 44, or a combination of both.

As a summary of the ADI technique, the Charge Leveling operation first initializes the circuit by filling the potential well of input node 74 to a well-defined level. After the integration, a known charge is added to this potential well in the Charge Pump operation, and finally this known charge is subtracted in BLC from the charge collected under PC 50. Based on these operations, ADI eliminates lag, preserves the correct value of resulting charge on PC 50, eliminates non-linearity of signal response, and increases injection efficiency.

Although it is not specifically related to ADI techniques, a fundamental drawback of pixel structures with a skimming gate (direct injection) is the induced kTC noise at the skimming gate's input node. It is thus preferable to keep the capacitance of input node as small as possible to minimize kTC noise.

FIGS. 10a-d are timing diagrams 280, 282, 284, and 286, respectively, that schematically illustrate processes of ADI, in accordance with embodiments of the invention. Timing diagrams 280, 282, 284, and 286 respectively illustrate four embodiments of Charge Leveling and Charge Pump operations for the 6T global shutter pixel architecture that is shown in FIG. 2. Timing diagrams 280, 282, 284, and 286 are extensions of timing diagram 90 shown in FIG. 4, with the time axis extended to comprise the full acquisition time, as well as the full Charge Pump operation.

Time stamps 292 now include, in addition to time stamps TS1-TS5 of FIG. 4, a time stamp TS6 denoting the Charge Pump operation. This operation can be achieved by applying a negative voltage pulse to $V_{ph}$ 76 before the end of the exposure period. In an alternative implementation of Charge Pump operation, a positive voltage pulse is applied to SkG 48 before the end of the exposure period. Although FIGS. 10a-d show global timings only for the 6T global shutter pixel architecture, the ADI pixel operation can be used to improve charge injection efficiency for any pixel structure that includes a skimming gate.

As the Charge Leveling and Charge Pump operations have already been described generally above, only the points of difference in timing diagrams 280, 282, 284, and 286 are explained in detail for FIGS. 10a-d, below.

Each of timing diagrams 280, 282, 284, and 286 comprises seven curves 280a-g, 282a-g, 284a-g, and 286a-g, respectively, with the curves showing potentials against a horizontal time axis. For timing diagram 280, curves 280a-g show the potentials as follows:

Curve 280a shows the potential at SG 46.
Curve 280b shows the potential at SD 58.
Curve 280c shows the potential at TX 62.
Curve 280d shows the potential at RST 64.
Curve 280e shows the potential at $V_{pix}$ 66.
Curve 280f shows the potential at $V_{ph}$ 76.
Curve 280g shows the potential at SkG 48.

A similar notation of assigning curves to potentials is used in timing diagrams 282, 284, and 286.

For the sake of clarity, curves 280a-g (as well as curves 282a-g, 284a-g, and 286a-g) have been individually shifted in the vertical direction, and do not refer to a common zero potential. Curve 280g (as well as curves 282g, 284g, and 286g), showing the potential of SkG 48, has been further shifted from its position in FIG. 4, again for the sake of clarity. The first five of time stamps 292 (TS1-TS5) as well as rising and falling edges 94, 96, 98, 100, 102, 104, 106, and 108, refer to FIG. 4.

In FIG. 10a, acquisition of charge from PD 40 starts at falling edge 106 of TX 62 at the end of Charge Leveling, and ends at a falling edge 294 of a charge transfer pulse 296 of TX 62, wherein the charge transfer pulse has started at a rising edge 298. The Charge Leveling operation and the acquisition time are denoted by double-headed arrows 300 and 301, respectively. The Charge Pump operation is initiated by a falling edge 302 of $V_{ph}$ 76 and concluded by its rising edge 304 after charge transfer pulse 296 and a reset pulse 310. Alternatively, as indicated by dotted lines on $V_{ph}$ 76 and SkG 48, the Charge Pump operation may be initiated by a rising edge 306 of SkG 48 and ended by its falling edge 308. The charge that has been accumulated at FD 56 during the integration is transferred by charge transfer pulse 296. RST gate 64 provides reset pulse 310, which starts with a rising edge 312 and ends with a falling edge 314 before the end of the acquisition time (end of charge transfer pulse 296) to handle the dark current signal or parasitic light signal accumulated at FD 56 during integration time.

In FIG. 10b, Charge Pump operation is initiated by a falling edge 320 of $V_{ph}$ 76 and concluded by its rising edge 322. Alternatively, as indicated by dotted lines on $V_{ph}$ 76 and SkG 48, the Charge Pump operation may be initiated by a rising edge 324 of SkG 48 and ended by its falling edge 326. Charge pump operation ends after a reset pulse 330 but before a charge transfer pulse 336. The acquisition of charge from PD 40 starts at falling edge 106 of TX 62 at the end of Charge Leveling, and ends at rising edge 322 of $V_{ph}$ 76. Alternatively, the acquisition of charge may end at falling edge 326 of SkG 48. The charge is accumulated at FD 56 during the integration. The Charge Leveling and the acquisition time are denoted by double-headed arrows 327 and 328, respectively.

RST gate 64 provides reset pulse 330 for FD 56, starting with a rising edge 332 and ending with a falling edge 334. Reset pulse 330 handles the dark current signal or parasitic light signal accumulated at FD 56 during the integration time. Charge transfer pulse 336 on TX 62 starts with a rising edge 338 and ends with a falling edge 340. The restoration of the voltage of $V_{ph}$ 76 by rising edge 322 (or alternatively the restoration of the voltage of SkG 48 by falling edge 326) takes place after falling edge 334 but before rising edge 338.

In FIG. 10c, Charge Pump operation is initiated by a falling edge 350 of $V_{ph}$ 76 and is concluded by its rising edge 352. Alternatively, as indicated by dotted lines on $V_{ph}$ 76 and SkG 48, the Charge Pump operation may be initiated by a rising edge 354 of SkG 48 and ended by its falling edge 356. The Charge Pump operation is terminated before a reset pulse 358 of RST 64, defined by a rising edge 360 and a falling edge 362, and before a charge transfer pulse 365. The acquisition of charge from PD 40 starts at falling edge 106 of TX 62 at the end of Charge Leveling, and ends at the completion of the Charge Pump operation. The charge is accumulated at FD 56 during the integration. The Charge Leveling operation and the acquisition time are denoted by double-headed arrows 363 and 364, respectively.

Reset pulse 358 handles the dark current signal or parasitic light signal accumulated at FD 56 during the integration time.

Figure 10D:
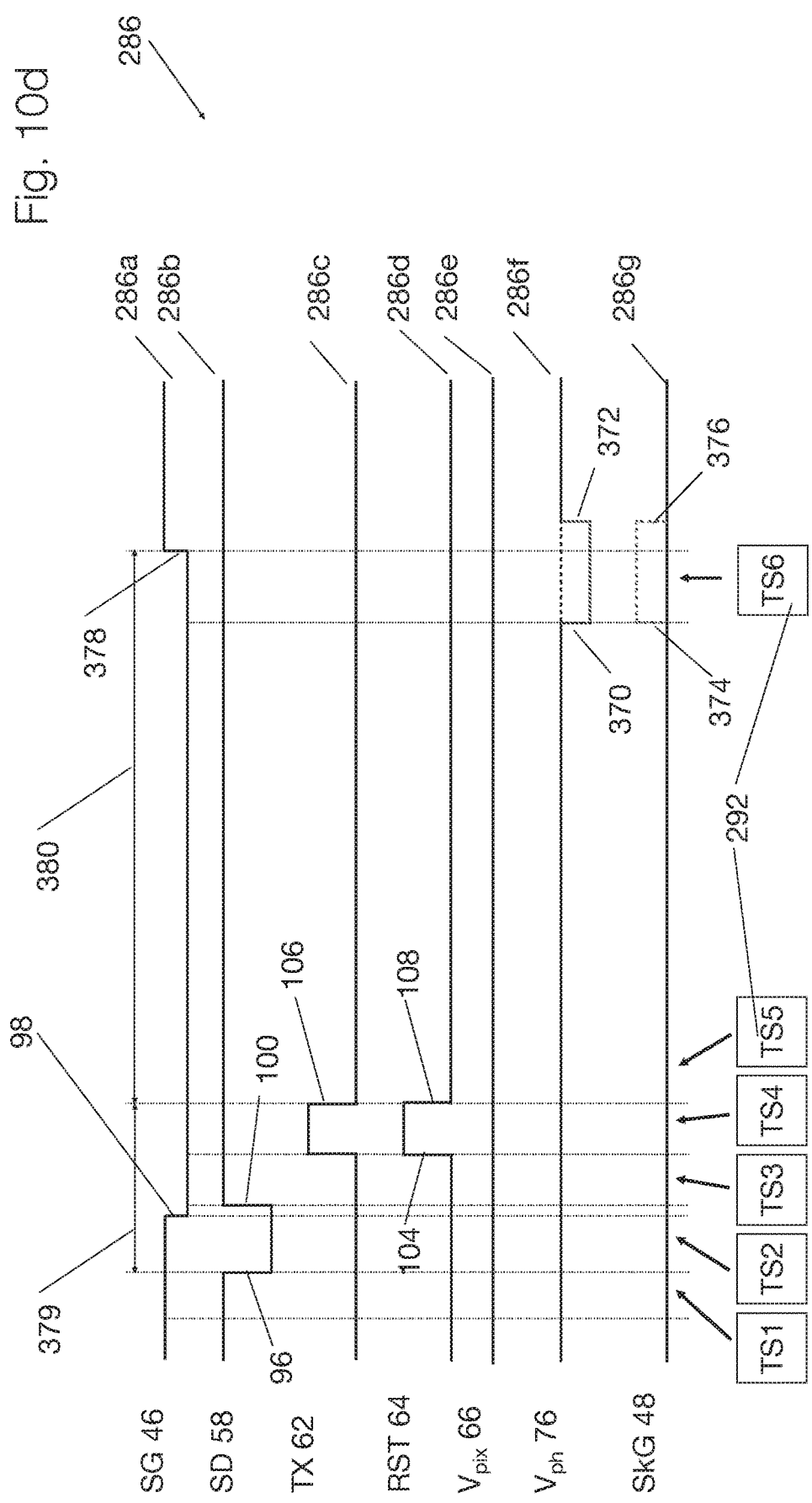

In FIG. 10d, Charge Pump operation is initiated by a falling edge 370 of $V_{ph}$ 76 and terminated by its rising edge 372. Alternatively, as indicated by dotted lines on $V_{ph}$ 76 and SkG 48, the Charge Pump operation may be initiated by a rising edge 374 of SkG 48 and terminated by its falling edge 376. The termination of the Charge Pump operation takes place before a positive pulsing time point (a rising edge 378) of SG 46. In this embodiment, the time window between falling edge 106 of TX 62 and rising edge 378 of SG 46 defines the acquisition time, denoted by a double arrow 380. The Charge Leveling operation is denoted by a double arrow 379. The charge is accumulated at FD 56 during the integration. SG 46 may also perform an anti-blooming (AB) function.

During the charge readout phase, RST 64, which resets FD 56, and TX 62, which transfers the charge to FD 56, are pulsed consecutively for each pixel of photodetector array 36 in a row-by-row operation. As timing diagram 286 refers to global signals, row-by-row reset and charge transfer pulses for readout from FD 56 are not shown in the diagram. In the embodiment of FIG. 10d, the kTC noise generated at FD 56 as a result of applying a pulse to RST 64 can thus be canceled with standard correlated double sampling techniques.

Dedicated Charge Pump Capacitor

Figure 11:
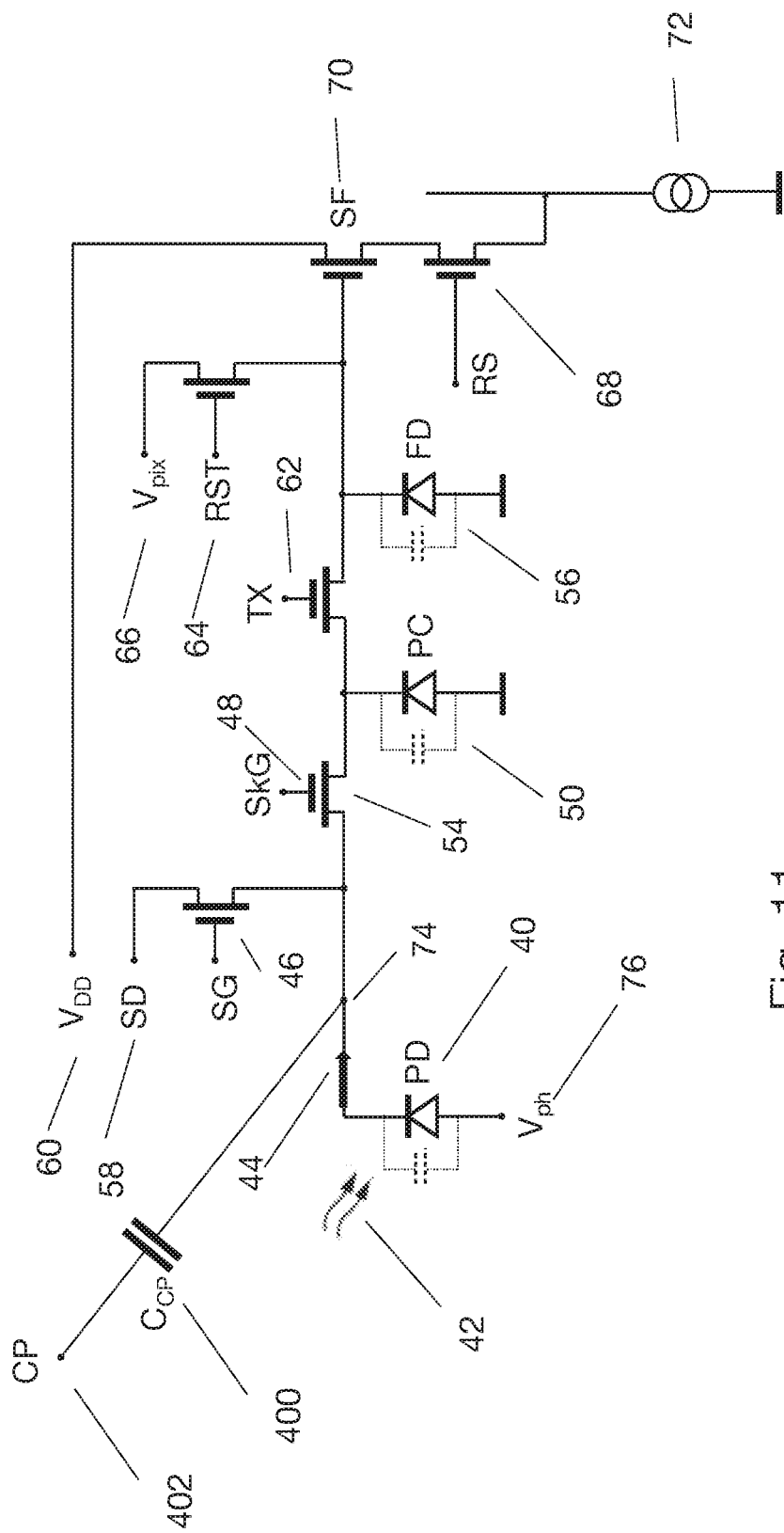
FIG. 11 is a schematic circuit diagram of a 6T global shutter pixel architecture for a hybrid image sensor with the addition of a dedicated charge-pump capacitor, in accordance with an embodiment of the invention.

FIG. 11 is a schematic circuit diagram of a 6T global shutter pixel architecture for hybrid image sensor 20 with the addition of a dedicated charge-pump capacitor $C_{CP}$ 400, in accordance with an embodiment of the invention.

In this embodiment, the operation of the Charge Pump is achieved by injecting a charge through capacitor $C_{CP}$ 400 by applying a voltage pulse to a Charge Pump node 402, rather than through the intrinsic capacitance of PD 40. FIG. 11 shows a circuit identical to the one shown in FIG. 2 (including the labels), with the addition of $C_{CP}$ 400. Dedicated charge-pump capacitor $C_{CP}$ 400 can be implemented by any type of capacitor that can be created using the applicable fabrication technology, such as CMOS technology, for example a pn-junction capacitor, MOSFET gate capacitor, or conductor-insulator-conductor capacitor. The variation of capacitance $C_{CP}$ 400 can be well controlled so that injection-induced fixed pattern noise can be mitigated.

FIGS. 12a-d are timing diagrams that schematically illustrate processes of ADI using dedicated charge-pump capacitor $C_{CP}$ 400, in accordance with embodiments of the invention. FIGS. 12a-d show four schematic timing diagrams 410, 412, 414, and 416 for Charge Leveling and Charge Pump operations in the 6T global shutter pixel architecture that is shown in FIG. 11. Timing diagrams 410, 412, 414, and 416 are similar to timing diagrams 280, 282, 284, and 286 shown in FIGS. 10a-d, respectively. The significant difference between the embodiments shown in FIGS. 10a-d and the embodiments shown in FIGS. 12a-d is that in the former, the Charge Pump operation is controlled by a voltage pulse on $V_{ph}$ 76 (or alternatively on SkG 48), whereas in the latter this operation is controlled by a voltage pulse on CP 402.

Timing diagrams 410, 412, 414, and 416 each comprise seven curves 410a-g, 412a-g, 414a-g, and 416a-g, respectively, with the curves showing different potentials against a horizontal time axis. For timing diagram 410, curves 410a-g show the potentials as follows:

Curve 410a shows the potential at SG 46.
Curve 410b shows the potential at SD 58.
Curve 410c shows the potential at TX 62.
Curve 410d shows the potential at RST 64.
Curve 410e shows the potential at $V_{pix}$ 66.
Curve 410f shows the potential at CP 402.
Curve 410g shows the potential at SkG 48.

A similar notation of assigning curves to potentials is used for timing diagrams 412, 414, and 416.

For the sake of clarity, curves 410a-g (as well as curves 412a-g, 414a-g, and 416a-g) have been individually shifted in the vertical direction, and do not refer to a common zero potential.

Time stamps 292 (TS1-TS6), as well as rising and falling signal edges 94, 96, 98, 100, 102, 104, 106, and 108, are the same as in FIGS. 10a-d.

In FIG. 12a, acquisition of charge from PD 40 starts at falling edge 106 of TX 62 at the end of Charge Leveling, and ends at a falling edge 420 of a charge transfer pulse 422 of TX 62, wherein the charge transfer pulse has started at a rising edge 424. The Charge Leveling operation and the acquisition time are denoted by double-headed arrows 425 and 426, respectively. The Charge Pump operation is initiated by a falling edge 428 of CP 402 and it is concluded by its rising edge 430 after charge transfer pulse 422 and a reset pulse 432. The charge that has been accumulated at FD 56 during the integration is transferred by charge transfer pulse 422. RST gate 64 provides reset pulse 432, which starts with a rising edge 434 and ends with a falling edge 436 before the end of the acquisition time (end of charge transfer pulse 422), to handle the dark current signal or parasitic light signal accumulated at FD 56 during integration time.

In FIG. 12b, Charge Pump operation is initiated by a falling edge 440 of CP 402 and terminated by its rising edge 442. The acquisition of charge from PD 40 starts at falling edge 106 of TX 62 at the end of Charge Leveling, and ends at rising edge 442 of CP 402. The charge is accumulated at FD 56 during the integration. The Charge Leveling operation and the acquisition time are denoted by double-headed arrows 443 and 444, respectively.

RST gate 64 provides a reset pulse 446 for FD 56 that starts with a rising edge 448 and ends with a falling edge 450. Reset pulse 446 handles the dark current signal or parasitic light signal accumulated at FD 56 during the integration time. A charge transfer pulse 452 on TX 62 starts with a rising edge 454 and ends with a falling edge 456. The restoration of the voltage of CP 402 by rising edge 442 takes place after falling edge 450 of reset pulse 446 but before rising edge 454 of charge transfer pulse 452.

In FIG. 12c, Charge Pump operation is initiated by a falling edge 460 of CP 402 and terminated by a rising edge 462. The Charge Pump operation is terminated before a reset pulse 464, defined by a rising edge 466 and a falling edge 468 of RST 64, and before a charge transfer pulse 471. The acquisition of charge from PD 40 starts at falling edge 106 of TX 62 at the end of Charge Leveling, and ends at the termination of the Charge Pump operation. The charge is accumulated at FD 56 during the integration. The Charge Leveling operation and the acquisition time are denoted by double-headed arrows 469 and 470, respectively.

Reset pulse 464 handles the dark current signal or parasitic light signal accumulated at FD 56 during the integration time.

In FIG. 12d, Charge Pump operation is initiated by a falling edge 480 of CP 402 and terminated by its rising edge 482. The termination of the Charge Pump operation takes place after a positive pulsing time point (rising edge) 484 of SG 46. In this embodiment, the time window between falling edge 106 of TX 62 rising edge 484 of SG 46 defines the acquisition time, denoted by a double arrow 486. The Charge Leveling operation is denoted by a double arrow 485. The charge is accumulated at FD 56 during the integration.

During the charge readout phase, RST 64, which resets FD 56, and TX 62 are pulsed consecutively between different rows of photodetector array 36 in a row-by-row operation. As timing diagram 416 refers to global signals, row-by-row reset and charge transfer pulses are not shown in the diagram. The kTC noise generated at FD 56 can thus be canceled. The cancellation of the kTC noise in this embodiment is similar to that described with reference to FIG. 10d.

Although the above embodiments refer to examples in which electrons are collected from a photosensitive element, the principles of the present invention may also be applied to architectures in which holes are collected. In such a case, reversing the ADI charge-pump voltage-polarity injects the necessary holes.

Furthermore, although the embodiments described above refer specifically to 6T pixel architectures, the principles of the present invention may alternatively be applied, mutatis mutandis, in 5T, 7T, and other suitable architectures for readout of photocharge from quantum films and other photosensitive media.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Imaging apparatus, comprising:
   a photosensitive medium configured to convert incident photons into charge carriers;
   a bias electrode, which is at least partially transparent, overlying the photosensitive medium and configured to apply a bias potential to the photosensitive medium;
   an array of pixel circuits formed on a semiconductor substrate, each pixel circuit defining a respective pixel and comprising:
   a pixel electrode coupled to collect the charge carriers from the photosensitive medium;
   a readout circuit configured to output a signal indicative of a quantity of the charge carriers collected by the pixel electrode;
   a skimming gate coupled between the pixel electrode and the readout circuit; and
   a shutter gate coupled in parallel with the skimming gate between a node in the pixel circuit and a sink site; and
   control circuitry coupled to sequentially open and close the shutter gate and the skimming gate of each of the pixels in each of a sequence of image frames so as to apply a global shutter to the array and then to read out the collected charge carriers via the skimming gate to the readout circuit.

2. The apparatus according to claim 1, wherein the pixel circuit comprises:
   a charge storage node between the skimming gate and the readout circuit;
   at least one charge transfer gate that connects to the charge storage node; and
   a reset gate coupled between the charge transfer gate and a reset potential and configured to reset the charge stored on the charge storage node under control of the control circuitry.

3. The apparatus according to claim 2, wherein the at least one charge transfer gate comprises:
   a first charge transfer gate coupled between the charge storage node and a further storage node; and
   a second charge transfer gate connected between the further storage node and the reset gate.

4. The apparatus according to claim 2, wherein the control circuitry is configured, in each of the image frames, to actuate one of the gates, selected from a group consisting of the shutter gate and the reset gate, so as to fill a potential well at the pixel electrode with charge carriers, and then to close the shutter gate, whereby the charge carriers acquired at the pixel electrode from the photosensitive medium is transferred through the skimming gate to the readout circuit.

5. The apparatus according to claim 4, wherein while the one of the gates is actuated, a potential well of the charge storage node is filled with the charge carriers, and wherein the control circuitry is configured, prior to acquiring the charge carriers, to actuate the reset gate and the at least one charge transfer gate so as to allow the charge carriers to drain from the charge storage node while the charge carriers remain in the potential well at the pixel electrode.

6. The apparatus according to claim 1, wherein the control circuitry is configured, after acquisition of the charge carriers in a potential well at the pixel electrode in each of the image frames, to apply a charge pump signal so as to inject an additional number of charge carriers into the potential well at the pixel electrode before reading out the charge carriers to the readout circuit.

7. The apparatus according to claim 6, wherein the charge pump signal is applied to at least one circuit location, selected from a group of locations consisting of the bias electrode and the skimming gate.

8. The apparatus according to claim 6, and comprising a charge pump capacitor coupled to the pixel electrode, and wherein the charge pump signal is applied to the charge pump capacitor.

9. The apparatus according to claim 6, wherein the control circuitry is configured to subtract from the signal that has been read out to the readout circuit a signal level corresponding to the additional number of charge carriers.

10. The apparatus according to claim 1, wherein the photosensitive medium comprises a photosensitive film.

11. The apparatus according to claim 10, wherein the photosensitive film comprises at least one photodetector material selected from a first group of materials consisting of elemental semiconductors, compound semiconductors, colloidal nanocrystals, epitaxial quantum wells, epitaxial quantum dots, organic photoconductors, and bulk heterojunction organic photoconductors, and wherein the at least one selected photoconductor material has a device configuration selected from a second group of configurations consisting of photoconductors, p-n junctions, heterojunctions, Schottky diodes, quantum well stacks, quantum wires, quantum dots, phototransistors, and series and parallel connected combinations of these configurations.

12. Imaging apparatus, comprising:
a photosensitive medium configured to convert incident photons into charge carriers;
a bias electrode, which is at least partially transparent, overlying the photosensitive medium and configured to apply a bias potential to the photosensitive medium;
an array of pixel circuits formed on a semiconductor substrate, each pixel circuit defining a respective pixel and comprising:
a pixel electrode coupled to collect the charge carriers from the photosensitive medium;
a readout circuit configured to output a signal indicative of a quantity of the charge carriers collected by the pixel electrode;
a plurality of gates, including a skimming gate coupled between the pixel electrode and the readout circuit; and
a charge storage node between the skimming gate and the readout circuit; and
control circuitry coupled to actuate the gates prior to an acquisition period during each of a sequence of image frames so as to fill a potential well at the pixel electrode with charge carriers, and then following the acquisition period to transfer the charge carriers acquired at the pixel electrode from the photosensitive medium through the skimming gate to the charge storage node for readout by the readout circuit.

13. The apparatus according to claim 12, wherein the plurality of gates comprises a reset gate coupled between the charge storage node and a reset potential and configured to reset the charge stored on the charge storage node under control of the control circuitry, and
wherein while the gates are actuated, a potential well of the charge storage node is also filled with the charge carriers, and
wherein the control circuitry is configured, prior to acquiring the charge carriers, to actuate the reset gate so as to allow the charge carriers to drain from the charge storage node while the charge carriers remain in the potential well at the pixel electrode.

14. The apparatus according to claim 13, wherein the control circuitry is further configured to actuate the reset gate so as to fill the potential well at the pixel electrode with the charge carriers, and then to close the reset gate, whereby photocharge acquired at the pixel electrode is transferred to the readout circuit.

15. Imaging apparatus, comprising:
a photosensitive medium configured to convert incident photons into charge carriers;
a bias electrode, which is at least partially transparent, overlying the photosensitive medium and configured to apply a bias potential to the photosensitive medium;
an array of pixel circuits formed on a semiconductor substrate, each pixel circuit defining a respective pixel and comprising:
a pixel electrode coupled to collect the charge carriers from the photosensitive medium;
a readout circuit configured to output a signal indicative of a quantity of the charge carriers collected by the pixel electrode;
a plurality of gates, including a skimming gate coupled between the pixel electrode and the readout circuit; and
a charge storage node between the skimming gate and the readout circuit; and
control circuitry coupled, after acquisition of the charge carriers in a potential well at the pixel electrode in each of a sequence of image frames, to apply a charge pump signal so as to inject an additional number of charge carriers into a potential well at the pixel electrode, and then to actuate the gates so as to transfer the charge carriers acquired at the pixel electrode from the photosensitive medium through the skimming gate to the charge storage node for readout by the readout circuit.

16. The apparatus according to claim 15, and comprising a charge pump capacitor coupled to the pixel electrode, and wherein the charge pump signal is applied to the charge pump capacitor.

* * * * *